(12) United States Patent
Negley et al.

(10) Patent No.: US 8,508,117 B2
(45) Date of Patent: Aug. 13, 2013

(54) HIGH CRI LIGHTING DEVICE WITH ADDED LONG-WAVELENGTH BLUE COLOR

(75) Inventors: Gerald H. Negley, Chapel Hill, NC (US); Antony Paul van de Ven, Hong Kong (CN); Bernd P. Keller, Santa Barbara, CA (US); Ronan P. LeToquin, Ventura, CA (US); Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/030,421

(22) Filed: Feb. 18, 2011

(65) Prior Publication Data

US 2011/0222277 A1   Sep. 15, 2011

Related U.S. Application Data

(63) Continuation of application No. 12/720,387, filed on Mar. 9, 2010.

(51) Int. Cl.
*H01J 1/62* (2006.01)
*H05B 33/00* (2006.01)

(52) U.S. Cl.
USPC ............................. 313/501; 313/503; 313/512

(58) Field of Classification Search
USPC .................. 313/498–512, 483–486; 362/231
See application file for complete search history.

(56) References Cited

U.S. PATENT DOCUMENTS

| | | | |
|---|---|---|---|
| 4,966,862 A | 10/1990 | Edmond | |
| 5,027,168 A | 6/1991 | Edmond | |
| 5,210,051 A | 5/1993 | Carter, Jr. | |
| 5,338,944 A | 8/1994 | Edmond et al. | |
| 5,359,345 A | 10/1994 | Hunter | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |

(Continued)

FOREIGN PATENT DOCUMENTS

| | | |
|---|---|---|
| DE | 10233050 A1 | 2/2004 |
| JP | 2004-071726 A | 3/2004 |

(Continued)

OTHER PUBLICATIONS

Comrie, M. , "Full Color LED Added to Lumex's Lineup", "EBN", Jun. 19, 1995, p. 28.

(Continued)

*Primary Examiner* — Joseph L Williams
(74) *Attorney, Agent, or Firm* — Vincent K. Gustafson; Jenkins, Wilson, Taylor & Hunt, P.A.

(57) ABSTRACT

Solid state lighting devices include least one solid state emitter and multiple lumiphors, arranged to output aggregated emissions comprising at least one short wavelength blue peak, at least one long wavelength blue (LWB) peak, at least one yellow and/or green peak, and at least one red and/or orange peak. Presence of long wavelength blue enhances color rendering. At least one solid state emitter may include a short wavelength blue LED, LWB LED, and/or UV LED. Multiple emitters may be provided. Resulting devices may provide CRI greater than 85, efficiency of greater than 50 lm/watt, and color stability in a range of $\Delta u'v' \leqq 0.008$ over a temperature change of 75° C.

20 Claims, 19 Drawing Sheets

(56) References Cited

U.S. PATENT DOCUMENTS

| | | | |
|---|---|---|---|
| 5,912,477 | A | 6/1999 | Negley |
| 6,201,262 | B1 | 3/2001 | Edmond et al. |
| 6,498,440 | B2 | 12/2002 | Stam et al. |
| 6,577,073 | B2 | 6/2003 | Shimizu et al. |
| 6,600,175 | B1 | 7/2003 | Baretz et al. |
| 6,791,119 | B2 | 9/2004 | Slater, Jr. et al. |
| 6,853,010 | B2 | 2/2005 | Slater, Jr. et al. |
| 6,958,497 | B2 | 10/2005 | Emerson et al. |
| 7,005,679 | B2 | 2/2006 | Tarsa et al. |
| 7,061,454 | B2 | 6/2006 | Sasuga et al. |
| 7,083,302 | B2 | 8/2006 | Chen et al. |
| 7,095,056 | B2 | 8/2006 | Vitta et al. |
| 7,213,940 | B1 | 5/2007 | van de Ven et al. |
| 7,456,499 | B2 | 11/2008 | Loh et al. |
| 7,564,180 | B2 | 7/2009 | Brandes |
| 7,614,759 | B2 | 11/2009 | Negley |
| 2004/0218387 | A1 | 11/2004 | Gerlach |
| 2005/0082974 | A1* | 4/2005 | Fukasawa et al. ............ 313/512 |
| 2005/0265024 | A1 | 12/2005 | Luk |
| 2006/0067073 | A1 | 3/2006 | Ting |
| 2006/0149607 | A1 | 7/2006 | Sayers et al. |
| 2006/0221272 | A1 | 10/2006 | Negley et al. |
| 2007/0139920 | A1 | 6/2007 | Van De Ven et al. |
| 2007/0139923 | A1 | 6/2007 | Negley et al. |
| 2007/0158668 | A1 | 7/2007 | Tarsa et al. |
| 2007/0170447 | A1* | 7/2007 | Negley et al. ................... 257/98 |
| 2007/0223219 | A1 | 9/2007 | Medendorp et al. |
| 2007/0247852 | A1 | 10/2007 | Wang |
| 2007/0253209 | A1 | 11/2007 | Loh et al. |
| 2007/0259206 | A1 | 11/2007 | Oshio |
| 2007/0267983 | A1* | 11/2007 | Van De Ven et al. ......... 315/294 |
| 2007/0278934 | A1 | 12/2007 | van de Ven et al. |
| 2008/0012036 | A1 | 1/2008 | Loh et al. |
| 2008/0121921 | A1 | 5/2008 | Loh et al. |
| 2008/0130285 | A1 | 6/2008 | Negley et al. |
| 2008/0136313 | A1* | 6/2008 | Van De Ven et al. ......... 313/500 |
| 2008/0173884 | A1 | 7/2008 | Chitnis et al. |
| 2008/0179611 | A1 | 7/2008 | Chitnis et al. |
| 2008/0198112 | A1 | 8/2008 | Roberts |
| 2008/0231166 | A1* | 9/2008 | Su ................................. 313/498 |
| 2008/0304260 | A1* | 12/2008 | Van De Ven et al. ......... 362/231 |
| 2008/0308825 | A1 | 12/2008 | Chakraborty et al. |
| 2009/0046453 | A1 | 2/2009 | Kramer |
| 2009/0050907 | A1 | 2/2009 | Yuan et al. |
| 2009/0050908 | A1 | 2/2009 | Yuan et al. |
| 2009/0080185 | A1 | 3/2009 | McMillan |
| 2009/0184616 | A1* | 7/2009 | Van De Ven et al. ............. 313/1 |
| 2009/0195137 | A1 | 8/2009 | Brandes |
| 2010/0127283 | A1 | 5/2010 | van de Ven et al. |
| 2011/0037388 | A1* | 2/2011 | Lou et al. ........................ 315/35 |
| 2011/0221330 | A1 | 9/2011 | Negley et al. |
| 2011/0273079 | A1* | 11/2011 | Pickard et al. ................ 313/483 |

FOREIGN PATENT DOCUMENTS

| | | |
|---|---|---|
| JP | 2004-080046 A | 3/2004 |
| JP | 2005-005482 A | 1/2005 |
| JP | 2006-245443 A | 3/2005 |
| JP | 2006-261702 A | 9/2006 |
| JP | 2007-258620 A | 10/2007 |
| JP | 2007-266579 A | 10/2007 |
| KR | 10 2007 0068709 B1 | 7/2007 |
| WO | WO-2008053012 A1 | 2/2008 |
| WO | WO-2009013317 A1 | 1/2009 |
| WO | WO2009132508 * | 11/2009 |

OTHER PUBLICATIONS

International Search Report issued in International Patent Application No. PCT/US2011/025484 on Oct. 31, 2011.
Office Action issued in U.S. Appl. No. 12/720,387 on Jan. 15, 2013.

* cited by examiner

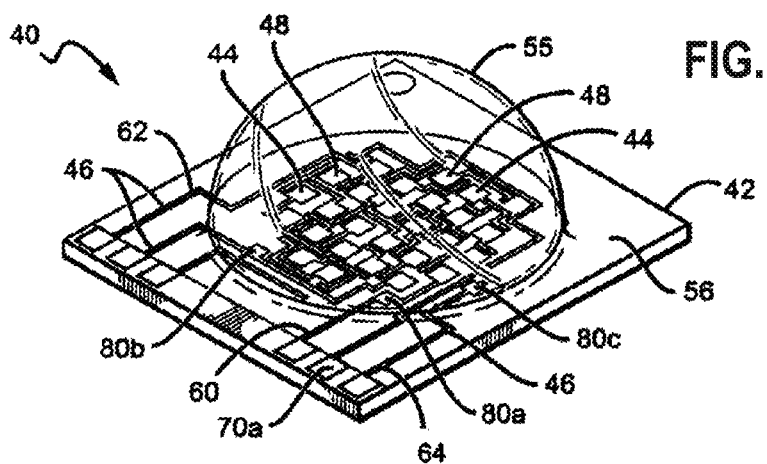
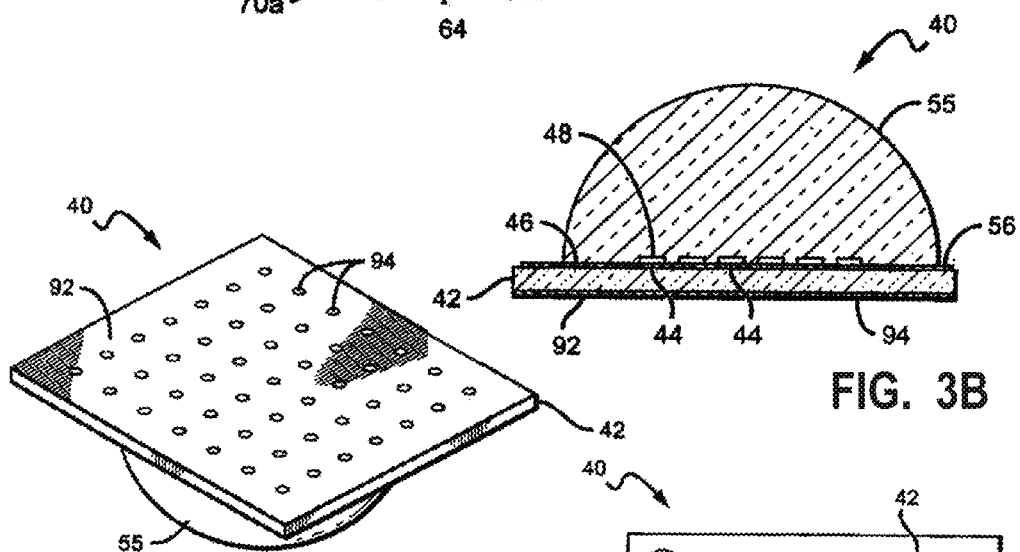
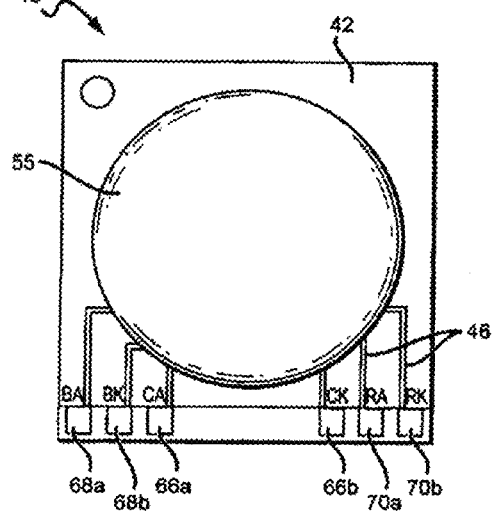

Figure 4A:
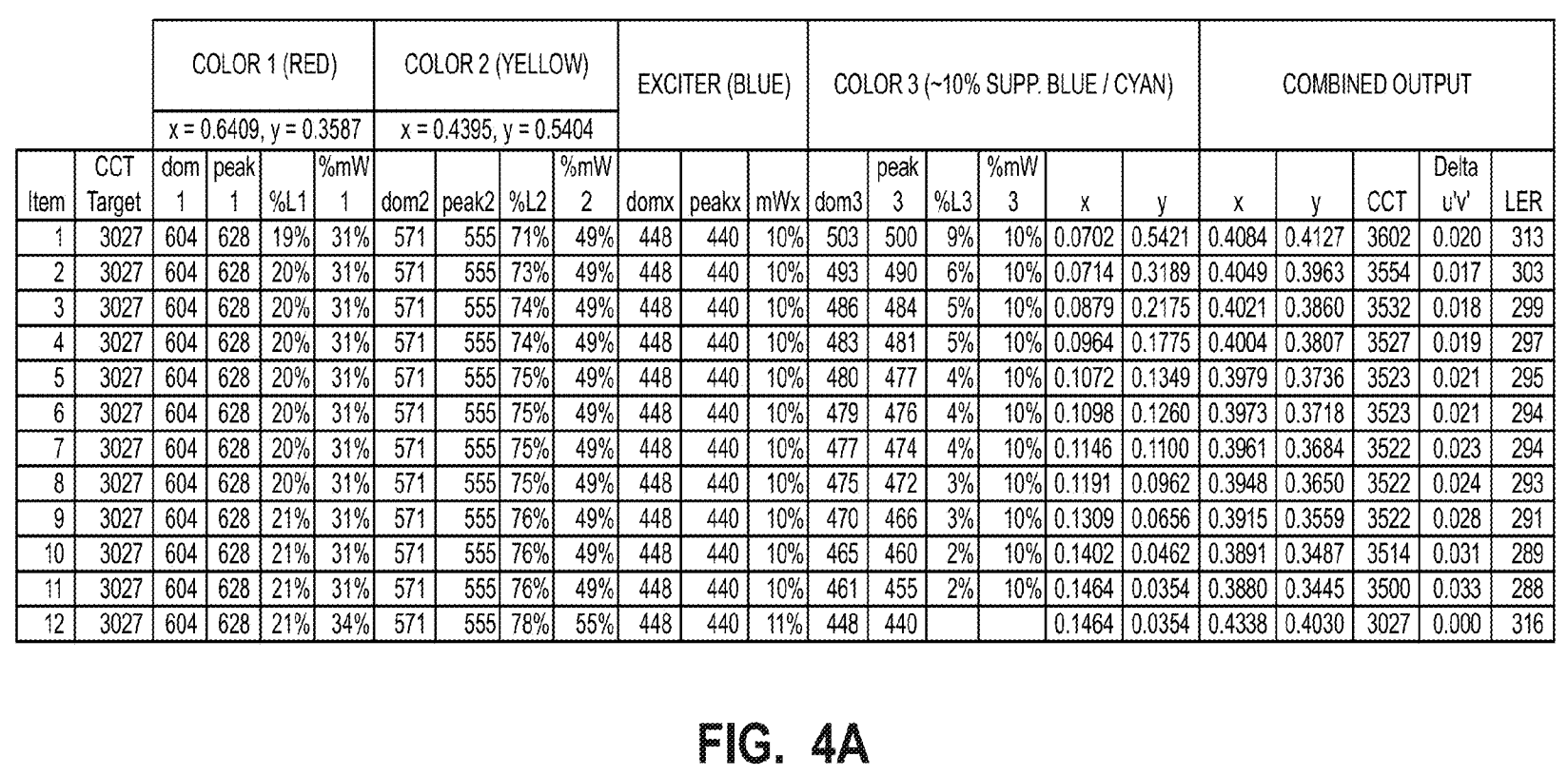

| | CCT Target | COLOR 1 (RED) x = 0.6409, y = 0.3587 | | | | COLOR 2 (YELLOW) x = 0.4395, y = 0.5404 | | | | EXCITER (BLUE) | | | COLOR 3 (~10% SUPP. BLUE / CYAN) | | | | COMBINED OUTPUT | | | | |
|---|---|---|---|---|---|---|---|---|---|---|---|---|---|---|---|---|---|---|---|---|---|
| Item | | dom1 | peak1 | %L1 | %mW 1 | dom2 | peak2 | %L2 | %mW 2 | domx | peakx | mWx | dom3 | peak 3 | %L3 | %mW 3 | x | y | CCT | Delta u'v' | LER |
| 1 | 3027 | 604 | 628 | 19% | 31% | 571 | 555 | 71% | 49% | 448 | 440 | 10% | 503 | 500 | 9% | 10% | 0.0702 | 0.5421 | 0.4084 | 0.4127 | 3602 | 0.020 | 313 |
| 2 | 3027 | 604 | 628 | 20% | 31% | 571 | 555 | 73% | 49% | 448 | 440 | 10% | 493 | 490 | 6% | 10% | 0.0714 | 0.3189 | 0.4049 | 0.3963 | 3554 | 0.017 | 303 |
| 3 | 3027 | 604 | 628 | 20% | 31% | 571 | 555 | 74% | 49% | 448 | 440 | 10% | 486 | 484 | 5% | 10% | 0.0879 | 0.2175 | 0.4021 | 0.3860 | 3532 | 0.018 | 299 |
| 4 | 3027 | 604 | 628 | 20% | 31% | 571 | 555 | 74% | 49% | 448 | 440 | 10% | 483 | 481 | 5% | 10% | 0.0964 | 0.1775 | 0.4004 | 0.3807 | 3527 | 0.019 | 297 |
| 5 | 3027 | 604 | 628 | 20% | 31% | 571 | 555 | 75% | 49% | 448 | 440 | 10% | 480 | 477 | 4% | 10% | 0.1072 | 0.1349 | 0.3979 | 0.3736 | 3523 | 0.021 | 295 |
| 6 | 3027 | 604 | 628 | 20% | 31% | 571 | 555 | 75% | 49% | 448 | 440 | 10% | 479 | 476 | 4% | 10% | 0.1098 | 0.1260 | 0.3973 | 0.3718 | 3523 | 0.021 | 294 |
| 7 | 3027 | 604 | 628 | 20% | 31% | 571 | 555 | 75% | 49% | 448 | 440 | 10% | 477 | 474 | 4% | 10% | 0.1146 | 0.1100 | 0.3961 | 0.3684 | 3522 | 0.023 | 294 |
| 8 | 3027 | 604 | 628 | 20% | 31% | 571 | 555 | 75% | 49% | 448 | 440 | 10% | 475 | 472 | 3% | 10% | 0.1191 | 0.0962 | 0.3948 | 0.3650 | 3522 | 0.024 | 293 |
| 9 | 3027 | 604 | 628 | 21% | 31% | 571 | 555 | 76% | 49% | 448 | 440 | 10% | 470 | 466 | 3% | 10% | 0.1309 | 0.0656 | 0.3915 | 0.3559 | 3522 | 0.028 | 291 |
| 10 | 3027 | 604 | 628 | 21% | 31% | 571 | 555 | 76% | 49% | 448 | 440 | 10% | 465 | 460 | 2% | 10% | 0.1402 | 0.0462 | 0.3891 | 0.3487 | 3514 | 0.031 | 289 |
| 11 | 3027 | 604 | 628 | 21% | 31% | 571 | 555 | 76% | 49% | 448 | 440 | 10% | 461 | 455 | 2% | 10% | 0.1464 | 0.0354 | 0.3880 | 0.3445 | 3500 | 0.033 | 288 |
| 12 | 3027 | 604 | 628 | 21% | 34% | 571 | 555 | 78% | 55% | 448 | 440 | 11% | 448 | 440 | | | 0.1464 | 0.0354 | 0.4338 | 0.4030 | 3027 | 0.000 | 316 |

COLOR RENDERING INDEX (CRI) (~10% SUPP. BLUE / CYAN)

| Item | Ra | R9a | R14a | R14r | r1 | r2 | r3 | r4 | r5 | r6 | r7 | r8 | r9 | r10 | r11 | r12 | r13 | r14 |
|---|---|---|---|---|---|---|---|---|---|---|---|---|---|---|---|---|---|---|
| 1 | 93 | 89 | 90 | 85 | 93 | 94 | 97 | 96 | 93 | 95 | 96 | 84 | 56 | 88 | 98 | 76 | 93 | 98 |
| 2 | 93 | 90 | 91 | 87 | 95 | 99 | 97 | 92 | 94 | 98 | 91 | 82 | 60 | 97 | 92 | 83 | 96 | 99 |
| 3 | 93 | 89 | 90 | 86 | 95 | 99 | 97 | 90 | 93 | 96 | 90 | 82 | 62 | 97 | 88 | 80 | 97 | 99 |
| 4 | 92 | 89 | 90 | 86 | 95 | 99 | 97 | 89 | 93 | 95 | 89 | 82 | 62 | 97 | 87 | 79 | 97 | 100 |
| 5 | 92 | 89 | 89 | 86 | 95 | 98 | 97 | 88 | 93 | 94 | 89 | 82 | 63 | 95 | 85 | 76 | 97 | 99 |
| 6 | 92 | 89 | 89 | 85 | 95 | 98 | 97 | 88 | 92 | 94 | 89 | 82 | 63 | 95 | 85 | 75 | 97 | 99 |
| 7 | 92 | 89 | 89 | 85 | 95 | 98 | 97 | 88 | 92 | 93 | 89 | 82 | 64 | 94 | 84 | 74 | 97 | 98 |
| 8 | 91 | 88 | 88 | 84 | 94 | 98 | 96 | 87 | 92 | 93 | 89 | 82 | 64 | 93 | 84 | 73 | 97 | 98 |
| 9 | 91 | 88 | 87 | 83 | 94 | 97 | 94 | 87 | 91 | 91 | 89 | 83 | 64 | 89 | 83 | 69 | 96 | 96 |
| 10 | 90 | 87 | 86 | 83 | 94 | 95 | 92 | 86 | 91 | 89 | 89 | 83 | 64 | 85 | 83 | 67 | 95 | 94 |
| 11 | 89 | 86 | 85 | 83 | 93 | 94 | 89 | 86 | 90 | 88 | 88 | 83 | 63 | 81 | 82 | 67 | 94 | 92 |
| 12 | 83 | 77 | 76 | 71 | 84 | 87 | 85 | 83 | 80 | 79 | 89 | 74 | 34 | 65 | 80 | 50 | 84 | 90 |

FIG. 6B

COLOR RENDERING INDEX (CRI) (~6% SUPP. BLUE / CYAN)

| Item | Ra | R9a | R14a | R14r | r1 | r2 | r3 | r4 | r5 | r6 | r7 | r8 | r9 | r10 | r11 | r12 | r13 | r14 |
|---|---|---|---|---|---|---|---|---|---|---|---|---|---|---|---|---|---|---|
| 1 | 89 | 84 | 84 | 80 | 90 | 94 | 94 | 87 | 88 | 90 | 90 | 78 | 49 | 81 | 83 | 68 | 91 | 95 |
| 2 | 88 | 84 | 84 | 80 | 90 | 94 | 93 | 86 | 87 | 89 | 90 | 78 | 50 | 81 | 82 | 67 | 91 | 95 |
| 3 | 88 | 84 | 84 | 80 | 90 | 94 | 92 | 86 | 87 | 87 | 90 | 78 | 50 | 80 | 82 | 66 | 91 | 95 |
| 4 | 88 | 83 | 83 | 79 | 89 | 93 | 91 | 85 | 87 | 86 | 89 | 78 | 50 | 78 | 81 | 63 | 91 | 94 |
| 5 | 87 | 83 | 82 | 78 | 89 | 92 | 89 | 85 | 86 | 86 | 89 | 78 | 49 | 76 | 81 | 61 | 90 | 93 |
| 6 | 83 | 77 | 76 | 71 | 84 | 87 | 85 | 83 | 80 | 79 | 89 | 74 | 34 | 65 | 80 | 50 | 84 | 90 |

FIG. 6A

| | | COLOR 1 (RED) | | | COLOR 2 (YELLOW) | | | | EXCITER (BLUE) | | | COLOR 3 (~6% SUPP. BLUE / CYAN) | | | | | COMBINED OUTPUT | | | | |
|---|---|---|---|---|---|---|---|---|---|---|---|---|---|---|---|---|---|---|---|---|---|
| | | x = 0.6409, y = 0.3587 | | | x = 0.4395, y = 0.5404 | | | | | | | | | | | | | | | Delta | |
| Item | CCT Target | dom 1 | peak 1 | %L1 | %mW 1 | dom2 | peak2 | %L2 | %mW 2 | domx | peakx | mWx | dom3 | peak 3 | %L3 | %mW 3 | x | y | CCT | u'v' | LER |
| 1 | 3027 | 604 | 628 | 21% | 33% | 571 | 555 | 76% | 52% | 448 | 440 | 10% | 480 | 477 | 2% | 6% | 0.1072 | 0.1349 | 0.4139 | 0.3867 | 3277 | 0.011 | 304 |
| 2 | 3027 | 604 | 628 | 21% | 33% | 571 | 555 | 76% | 52% | 448 | 440 | 10% | 477 | 474 | 2% | 6% | 0.1146 | 0.1100 | 0.4128 | 0.3837 | 3274 | 0.012 | 304 |
| 3 | 3027 | 604 | 628 | 21% | 33% | 571 | 555 | 76% | 52% | 448 | 440 | 10% | 475 | 472 | 2% | 6% | 0.1191 | 0.0962 | 0.4120 | 0.3818 | 3273 | 0.013 | 303 |
| 4 | 3027 | 604 | 628 | 21% | 33% | 571 | 555 | 77% | 52% | 448 | 440 | 10% | 470 | 466 | 1% | 6% | 0.1309 | 0.0656 | 0.4100 | 0.3764 | 3268 | 0.015 | 302 |
| 5 | 3027 | 604 | 628 | 21% | 33% | 571 | 555 | 77% | 52% | 448 | 440 | 10% | 465 | 460 | 1% | 6% | 0.1402 | 0.0462 | 0.4085 | 0.3722 | 3261 | 0.017 | 301 |
| 6 | 3027 | 604 | 628 | 21% | 34% | 571 | 555 | 78% | 55% | 448 | 440 | 11% | 461 | 455 | 0% | 0% | 0.1309 | 0.0656 | 0.4338 | 0.4030 | 3027 | 0.000 | 316 |

| BLUE: WW | RF RATIO | LF RATIO | CRI |
|---|---|---|---|
| 1:25 | 5.10% | 2.50% | 87.36 |
| 1:18 | 7.06% | 3.45% | 88.2 |
| 0 | | | 81.46 |

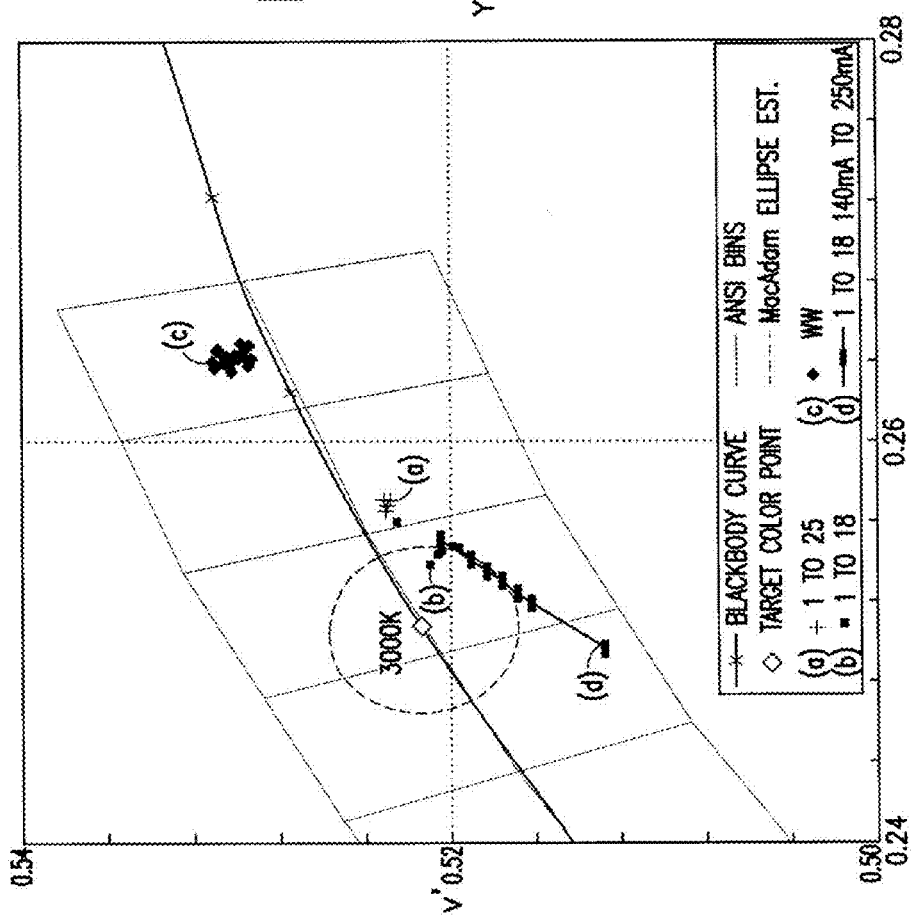

(a) ⊕ Xbin +AlInGaP - Q2/Q3 and H10 flux bin (standard)
(b) + WW+Cyan (1:18 and 1:25 ratio) – 63lm flux bin
(c) * WW+Cyan (2:24 ratio) – 45-55lm flux bin
(d) Y WW+Cyan (1:25) ratio – hypothetical 72lm flux bin (a) ⊕ Xbin +AlInGaP - Q2/Q3 and H10 flux bin (standard)
(b) + WW+Cyan (1:18 and 1:25 ratio) – 63lm flux bin
(c) * WW+Cyan (2:24 ratio) – 45-55lm flux bin
(d) Y WW+Cyan (1:25) ratio – hypothetical 72lm flux bin

US 8,508,117 B2

HIGH CRI LIGHTING DEVICE WITH ADDED LONG-WAVELENGTH BLUE COLOR

STATEMENT OF RELATED APPLICATION(S)

This is a continuation of U.S. patent application Ser. No. 12/720,387 filed on Mar. 9, 2010. The disclosure of the foregoing application is hereby incorporated by reference herein, for all purposes.

TECHNICAL FIELD

The present invention relates to solid state lighting devices—including devices arranged to output emissions perceived as white or near white in color—and methods of making and using same.

BACKGROUND

Solid state light sources may be utilized to provide colored (e.g., non-white) or white LED light (e.g., perceived as being white or near-white). White solid state emitters have been investigated as potential replacements for white incandescent lamps. A solid state lighting device may include, for example, at least one organic or inorganic light emitting diode ("LED") or a laser. A solid state lighting device produces light by exciting electrons across the band gap between a conduction band and a valence band of a semiconductor active (light-emitting) layer, with the electron transition generating light at a wavelength that depends on the band gap. Thus, the color (wavelength) of the light emitted by a solid state emitter depends on the materials of the active layers thereof. Solid state light sources provide potential for very high efficiency relative to conventional incandescent or fluorescent sources, but solid state light sources present significant challenges in simultaneously achieving good efficacy, good color reproduction, and color stability (e.g., with respect to variations in operating temperature).

Color reproduction is typically measured using the Color Rendering Index (CRI Ra). CRI Ra is a modified average of the relative measurements of how the color rendition of an illumination system compares to that of a reference radiator when illuminating eight reference colors, i.e., it is a relative measure of the shift in surface color and brightness of an object when lit by a particular lamp. The CRI Ra equals 100 if the color coordinates and relative brightness of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80).

Aspects related to the present inventive subject matter can be represented on either the 1931 CIE (Commission International de I'Eclairage) Chromaticity Diagram or the 1976 CIE Chromaticity Diagram, both of which are well-known and readily available to those of ordinary skill in the art. The CIE Chromaticity Diagrams map out the human color perception in terms of two CIE parameters x and y (in the case of the 1931 diagram) or u' and v' (in the case of the 1976 diagram). The 1931 CIE Chromaticity Diagram is reproduced at FIG. 1, and the 1976 CIE Chromaticity Diagram (also known as (u' v') chromaticity diagram) is reproduced at FIG. 2. The spectral colors are distributed around the edge of the outlined space, which includes all of the hues perceived by the human eye. The boundary line represents maximum saturation for the spectral colors. The 1976 CIE Chromaticity Diagram is similar to the 1931 Diagram, except that the 1976 Diagram has been modified such that similar distances on the Diagram represent similar perceived differences in color.

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates (i.e., color points) that lie along the blackbody locus obey Planck's equation: $E(\lambda)=A\lambda^{-5}/(e^{B/T}-1)$, where E is the emission intensity, $\lambda$ is the emission wavelength, T the color temperature of the blackbody and A and B are constants. Color coordinates that lie on or near the blackbody locus yield pleasing white light to a human observer. The 1931 CIE Diagram (FIG. 1) includes temperature listings along the blackbody locus (embodying a curved line emanating from the right corner). These temperature listings show the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants which produce light that is on or near the blackbody locus can thus be described in terms of their color temperature. As used herein, the term "white light" refers to light that is perceived as white, is within 7 MacAdam ellipses of the black body locus on a 1931 CIE chromaticity diagram, and has a CCT ranging from 2000 K to 10,000 K.

Illumination with a CRI Ra of less than 50 is very poor and only used in applications where there is no alternative for economic issues. Lights with a CRI Ra between 70 and 80 have application for general illumination where the colors of objects are not important. For some general interior illumination, a CRI Ra>80 is acceptable. A light with color coordinates within 4 MacAdam step ellipses of the Planckian locus and a CRI Ra>85 is more suitable for general illumination purposes. CRI Ra>90 is preferable and provides greater color quality.

Many methods are known for allowing a lighting device to be adjustable in color temperature, including using a variable combination of warm white and cool white light sources, using red, green and blue light sources. However, all these methods generally provide low to medium CRI Ra.

A representative example of a white LED lamp includes a package of a blue LED chip (e.g., made of InGaN and/or GaN), coated with a phosphor (typically YAG:Ce or BOSE). Blue LEDs made from InGaN exhibit high efficiency (e.g., external quantum efficiency as high as 70%). In a blue LED/yellow phosphor lamp, the blue LED chip produces an emission with a wavelength of about 450 nm, and the phosphor produces yellow fluorescence with a peak wavelength of about 550 nm upon receipt of the blue emission. Part of the blue ray emitted from the blue LED chip passes through the phosphor, while another portion of the blue ray is absorbed by the phosphor, which becomes excited and emits a yellow ray. The viewer perceives an emitted mixture of blue and yellow light (sometimes termed 'blue shifted yellow' or 'BSY' light) as white light. Such light is typically perceived as cool white in color. A BSY device typically exhibits good efficacy but only medium CRI Ra (e.g., between 60 and 75), or very good CRI Ra and low efficacy.

Various methods exist to enhance cool white light to increase its warmth. To promote warm white colors, an orange phosphor or a combination of a red phosphor (e.g., CaAlSiN3 ('CASN') based phosphor) and yellow phosphor (e.g., Ce:YAG or YAG:Ce) can be used in conjunction with a blue LED. Cool white emissions from a BSY element (including a blue emitter and yellow phosphor) may also be supplemented with both a red LED (e.g., comprising AlInGaP, having a chromatic wavelength of approximately 641 nm) and a cyan LED (e.g., comprising InGaN, having a chromatic wavelength of approximately 506 nm), such as disclosed by U.S. Pat. No. 7,095,056 to Vitta, et al. ("Vitta"), to provide warmer light. While the arrangement disclosed in Vitta allows the correlated color temperature (CCT) to be changed, the CRI and the usefulness of the device reduces significantly at lower color temperatures, making this arrangement generally undesirable for indoor general illumination. Moreover, emitters of a device according to Vitta exhibit substantially different changes in intensity and/or chromaticity with respect to changes in device operating temperature, which may cause aggregate output of such a device to exhibit noticeable shifts in output color at different operating conditions.

As an alternative to stimulating a yellow phosphor with a blue LED, another method for generating white emissions involves combined use of red, green, and blue ("RGB") light emitting diodes in a single package. The combined spectral output of the red, green, and blue emitters may be perceived by a user as white light. Each "pure color" red, green, and blue diode typically has a full-width half-maximum (FWHM) wavelength range of from about 15 nm to about 30 nm. Due to the narrow FWHM values of these LEDs (particularly the green and red LEDs), aggregate emissions from the red, green, and blue LEDs exhibit very low color rendering in general illumination applications.

Another example of a known white LED lamp includes one or more ultraviolet (UV)-based LEDs combined with red, green, and blue phosphors. Such lamps typically provide reasonably high color rendering, but exhibit low efficacy due to Stokes losses.

The art continues to seek improved solid state lighting devices that address one or more limitations inherent to conventional devices.

SUMMARY

The present invention relates in various embodiments to lighting devices including at least one solid state emitter and multiple lumiphors, arranged to output aggregated emissions including at least four color peaks, with at least one short wavelength blue peak, at least one long wavelength blue peak, at least one yellow and/or green peak, and at least one red and/or orange peak. Long wavelength blue ("LWB") is desirable to enhance color rendering without compromising efficiency.

In one aspect, the invention relates to a lighting device comprising: at least one first solid state emitter having a first dominant wavelength in a range of from 430 nm to 470 nm; at least one second solid state emitter having a second dominant wavelength in a range of from 471 nm to 510 nm; at least one third solid state emitter having a third dominant wavelength in a range of from 600 nm to 650 nm; and at least one lumiphor arranged to receive emissions from any of the at least one first solid state emitter, the at least one second solid state emitter, and the at least one third solid state emitter, and to responsively emit light having a fourth dominant wavelength that differs from the first, second, and third dominant wavelength; wherein spectral output of the lighting device includes in combination at least a portion of emissions from each of the at least one first solid state emitter, the at least one second solid state emitter, the at least one third solid state emitter, and the at least one lumiphor.

In another aspect, the invention relates to a lighting device comprising: a solid state emitter having a dominant wavelength in a range of from 430 nm to 470 nm; a first lumiphor having a dominant wavelength in a range of from 471 nm to 510 nm; a second lumiphor having a dominant wavelength in a range of from 511 nm to 585 nm; and a third lumiphor having a dominant wavelength in a range of from 600 nm to 650 nm; wherein spectral output of the lighting device includes in combination at least a portion of emissions from each of the solid state emitter, the first lumiphor, the second lumiphor, and the third lumiphor.

In another aspect, the invention relates to a lighting device comprising: at least one solid state emitter emitting wavelengths substantially in at least one of the ultraviolet (UV) range and the near ultraviolet (NUV) range; a first lumiphor having a dominant wavelength in a range of from 430 nm to 470 nm; a second lumiphor having a dominant wavelength in a range of from 471 nm to 510 nm; a third lumiphor having a dominant wavelength in a range of from 511 nm to 585 nm; and a fourth lumiphor having a dominant wavelength in a range of from 600 nm to 650 nm; wherein each lumiphor is arranged to receive emissions from the at least one solid state emitter, and spectral output of the lighting device includes in combination at least a portion of emissions from each of the first lumiphor, the second lumiphor, the third lumiphor, and the fourth lumiphor.

In a further aspect, the invention relates to a lighting device comprising: a first solid state emitter having a dominant wavelength in a range of from 430 nm to 470 nm; a second solid state emitter having a dominant wavelength in a range of from 471 to 484 nm; a first lumiphor having a dominant wavelength in a range of from 511 nm to 585 nm, and arranged to interact with at least one of the first solid state emitter and the second solid state emitter to responsively output light; and a second lumiphor having a dominant wavelength in a range of from 600 to 650 nm, and arranged to interact with at least one of the first solid state emitter and the second solid state emitter to responsively output light; wherein spectral output of the lighting device includes in combination at least a portion of emissions from each of the first solid state emitter, the second solid state emitter, the first lumiphor, and the second lumiphor.

A further aspect of the invention relates to a lighting device comprising: at least one solid state emitter having a dominant wavelength of less than or equal to 470 nm, and a plurality of lumiphors arranged to receive emissions from the at least one solid state emitter and responsively output light; wherein the lighting device is arranged to output a first color peak in a wavelength range of from 430 nm to 470 nm, a second color peak in a wavelength range of from 471 nm to 510 nm, a third color peak within a wavelength range of from 511 nm to 585 nm, and a fourth color peak in a wavelength range of from 600 nm to 650 nm; and wherein the lighting device provides a color rendering index of greater than 85, provides efficiency of greater than 50 lumens per watt, and exhibits color stability with respect to temperature in a range of $\Delta u'v' \leq 0.008$ over a temperature change of 75° C.

A still further aspect of the invention relates to a lighting device comprising: a plurality of first solid state emitters having a dominant wavelength in a range of from 430 nm to 470 nm; at least one second solid state emitter having a dominant wavelength in a range of from 471 nm to 510 nm; a first lumiphor having a dominant wavelength in a range of from 511 nm to 585 nm, and arranged to interact with any of (a) at least one first solid state emitter of the plurality of first solid state emitters and (b) the second solid state emitter, to responsively output light; and a second lumiphor having a dominant wavelength in a range of from 600 nm to 650 nm, and arranged to interact with any of (a) at least one first solid state emitter of the plurality of solid state emitters and (b) the second solid state emitter, to responsively output light; wherein radiant flux of the at least one second solid state emitter is in a range of less than or equal to about 15% of total radiant flux of the lighting device.

In another aspect, lighting devices as described herein are used to illuminate an object, a space, or an environment.

In another aspect, any one or more features of the foregoing aspects may be combined for additional advantage. Other aspects, features and embodiments of the invention will be more fully apparent from the ensuing disclosure and appended claims.

BRIEF DESCRIPTION OF THE DRAWINGS

FIG. 3A is an upper perspective view of a multi-emitter solid state lighting package according to one embodiment of the present invention.

FIG. 3B is a side cross-sectional view of side view of the emitter package of FIG. 3A.

FIG. 3C is a lower perspective view of the emitter package of FIGS. 3A-3B.

FIG. 3D is a top plan view of the emitter package of FIGS. 3A-3C.

FIGS. 4A-4B embody first and second portions of a table including results of eleven simulations of a multi-emitter solid state lighting device including a primary short wavelength blue LED, a red phosphor, a yellow phosphor, a supplemental blue LED of different wavelengths providing 10% of total radiant flux of the device, and results of one comparative simulation of a similar lighting device lacking a supplemental blue LED.

FIGS. 6A-6B embody first and second portions of a table including results of five simulations of a multi-emitter solid state lighting device including a primary short wavelength blue LED, a red phosphor, a yellow phosphor, a supplemental blue LED of different wavelengths providing 6% of total radiant flux of the device, and results of one comparative simulation of a similar lighting device lacking a supplemental blue LED.

FIG. 10A includes comparative plots of color coordinates for several different solid state lighting devices on a portion of a 1976 CIE Chromaticity Diagram, including color coordinates for (a) 1:25 packages each including one LWB LED in combination with twenty-five WW components, with various emitters operating at 150 mA, (b) 1:18 packages including one LWB LED in combination with eighteen WW components, with various emitters operating at 150 mA, (c) WW components operating at 150 mA, and (d) a 1:18 package including eighteen WW components operating at 150 mA, in combination with one LWB LED subjected to varying current of 140 mA to 200 mA in 10 mA steps.

FIG. 10B is an overlay plot of radiant flux ratio (LWB to WW) and luminous flux ratio (LWB to WW) as a function of current supplied, for the solid state emitter device represented as data series (d) in FIG. 10A, with the emitter device including eighteen WW components operated at 150 mA in combination with one LWB LED subjected to varying current of 140 mA to 200 mA in 10 mA steps.

DETAILED DESCRIPTION

Figure 1:
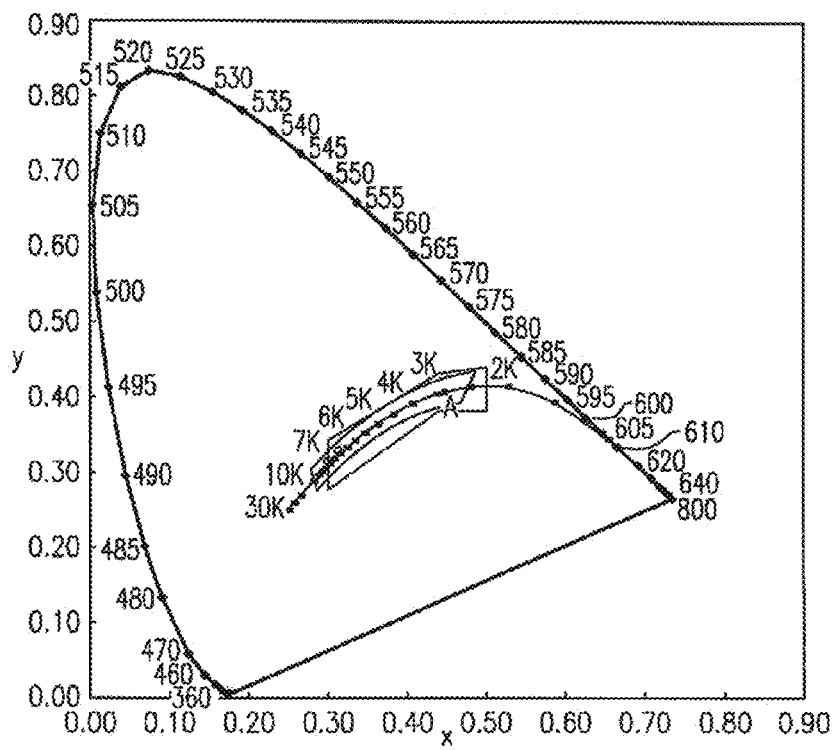
FIG. 1 is a 1931 CIE Chromaticity Diagram including representation of the blackbody locus.
Figure 2:
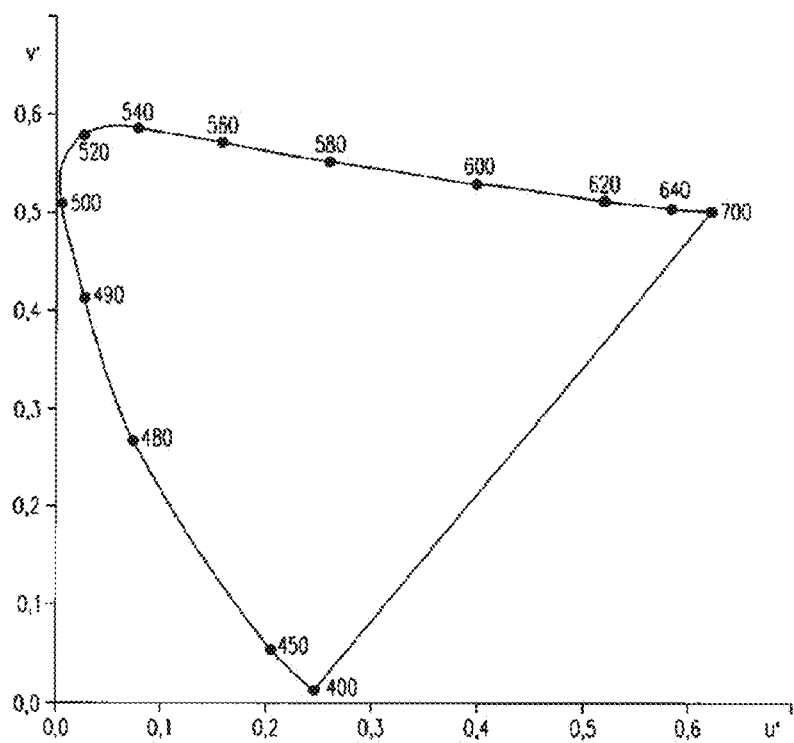
FIG. 2 is a 1976 CIE Chromaticity Diagram.

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the drawings, the size and relative sizes of layers and regions may be exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, no intervening elements are present. It will also be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

As used herein, the terms "solid state light emitter" or "solid state light emitting" device may include a light emitting diode, laser diode and/or other semiconductor device which includes one or more semiconductor layers, which may include (unless indicated to the contrary) silicon, silicon carbide, gallium nitride and/or other semiconductor materials, a substrate which may include sapphire, silicon, silicon carbide and/or other microelectronic substrates, and one or more contact layers which may include metal and/or other conductive materials. The design and fabrication of solid state light emitters are well known to those skilled in the art.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The present inventive subject matter further relates in certain embodiments to an illuminated enclosure (the volume of which can be illuminated uniformly or non-uniformly), comprising an enclosed space and at least one lighting device according to the present inventive subject matter, wherein the lighting device illuminates at least a portion of the enclosure (uniformly or non-uniformly).

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

The expression "peak emission wavelength", as used herein, means (1) in the case of a solid state light emitter, to the peak wavelength of light that the solid state light emitter emits if it is illuminated, and (2) in the case of a luminescent material, the peak wavelength of light that the luminescent material emits if it is excited.

The expression "correlated color temperature" or "CCT" is used according to its well-known meaning to refer to the temperature of a blackbody that is, in a well-defined sense (i.e., can be readily and precisely determined by those skilled in the art), nearest in color.

The expression "dominant wavelength", is used herein according to its well-known and accepted meaning to refer to the perceived color of a spectrum, i.e., the single wavelength of light which produces a color sensation most similar to the color sensation perceived from viewing light emitted by the light source (i.e., it is roughly akin to "hue"), as opposed to "peak wavelength", which is well-known to refer to the spectral line with the greatest power in the spectral power distribution of the light source. Because the human eye does not perceive all wavelengths equally (it perceives yellow and green better than red and blue), and because the light emitted by many solid state light emitter (e.g., LEDs) is actually a range of wavelengths, the color perceived (i.e., the dominant wavelength) is not necessarily equal to (and often differs from) the wavelength with the highest power (peak wavelength). A truly monochromatic light such as a laser has the same dominant and peak wavelengths.

Solid state light emitting devices according to embodiments of the invention may include III-V nitride (e.g., gallium nitride) based LEDs or lasers fabricated on a silicon carbide or gallium nitride substrates such as those devices manufactured and sold by Cree, Inc. of Durham, N.C. Such LEDs and/or lasers may be configured to operate such that light emission occurs through the substrate in a so-called "flip chip" orientation. Solid state emitter devices may also be configured to operate such that light emission occurs through the substrate. A solid state emitter chip may embody a vertical device with a cathode contact on one side of the chip, and an anode contact on an opposite side of the chip.

Some embodiments of the present invention may use solid state emitters, emitter packages, fixtures, luminescent materials/elements, power supplies, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; with the disclosures of the foregoing patents and published patent applications being hereby incorporated by reference as if set forth fully herein.

A solid state emitter as disclosed herein can be saturated or non-saturated. The term "saturated" as used herein means having a purity of at least 85%, with the term "purity" having a well-known meaning to those skilled in the art, and procedures for calculating purity being well-known to those skilled in the art.

A wide variety of luminescent materials (also known as lumiphors or luminophoric media, e.g., as disclosed in U.S. Pat. No. 6,600,175 and U.S. Patent Application Publication No. 2009/0184616, are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials (lumiphors) include scintillators, day glow tapes, nanophosphors, quantum dots, and inks that glow in the visible spectrum upon illumination with (e.g., ultraviolet) light. Inclusion of lumiphors in LED devices has been accomplished by providing layers (e.g., coatings) of such materials over solid state emitters and/or by dispersing luminescent materials to a clear encapsulant (e.g., epoxy-based or silicone-based curable resin) arranged to cover one or more solid state emitters.

Certain embodiments of the present invention relate to use of solid state emitter packages. A solid state emitter package typically includes at least one solid state emitter chip that is enclosed with packaging elements to provide environmental and/or mechanical protection, color selection, and light focusing, as well as electrical leads, contacts or traces enabling electrical connection to an external circuit. Encapsulant material, optionally including luminescent material, may be disposed over solid state emitters. Multiple solid state emitters may be provided in a single package. Individual emitters or groups of emitters in a solid state emitter package (e.g., wired in series) may be separately controlled. Multiple solid state emitter packages may be arranged in a single solid state lighting device. Individual solid state emitter packages or groups of solid state emitter packages (e.g., wired in series) may be separately controlled. Separate control of individual emitters, groups of emitters, individual packages, or groups of packages, may be provided by independently applying drive currents to the relevant components with control elements known to those skilled in the art. In one embodiment, at least one control circuit a may include a current supply circuit configured to independently apply an on-state drive current to each individual solid state emitter, group of solid state emitters, individual solid state emitter package, or group of solid state emitter packages. Such control may be responsive to a control signal (optionally including at least one sensor arranged to sense electrical, optical, and/or thermal properties), and a control system may be configured to selectively provide one or more control signals to the at least one current supply circuit. In various embodiments, current to different circuits or circuit portions may be pre-set, user-defined, or responsive to one or more inputs or other control parameters.

Embodiments of the present invention are directed to lighting devices that include at least one solid state emitter and multiple lumiphors, arranged to output aggregated emissions including at least four color peaks, with at least one short wavelength blue peak (e.g., having a dominant wavelength in a range of from about 430 nm to 470 nm); at least one long wavelength blue (LWB) peak, at least one yellow and/or green peak (e.g., having a dominant wavelength in a range of from about 511 nm to 585 nm), and at least one red and/or orange peak (e.g., having a dominant wavelength in a range of from 600 nm to 650 nm). In certain embodiments, a long wavelength blue peak has a dominant wavelength in a range of from 471 nm to 484 nm. In certain embodiments, a long wavelength blue peak may include longer wavelengths overlapping the cyan range, including a dominant wavelength in a range of from 471 nm to 510 nm. Various combinations of emitters and lumiphors are contemplated.

FIGS. 3A through 3E depict a multi-emitter solid state lighting component (namely, a package) 40 according to one embodiment of the present invention. Such package provides a basis for the "1:18" emitter package and "1:25" emitter package described in more detail below. The package 40 includes a submount 42 for supporting an array of LED chips 48, with the submount 42 having die pads 44 and conductive traces 46 along a top surface thereof. Each LED chip 48 is mounted to a different die pad 44. Various combinations of colored, white, and near-white emitters as disclosed herein may be arranged in the multi-emitter package 40. The LEDs chips 48 can have many different semiconductor layers arranged in different ways and can emit many different colors in different embodiments according to the present invention. LED structures, features, and their fabrication and operation are generally known in the art and only briefly discussed herein.

LED chips 48 can be fabricated using known processes, with a suitable process being fabrication of layers using metal organic chemical vapor deposition (MOCVD). LED chips generally comprise an active layer/region sandwiched between first and second oppositely doped layers, with the various layers being formed in succession on or over a growth substrate. LED chips can be formed groupwise on a wafer and then diced into single chips for mounting in a package. A growth substrate may remain as part of a final singulated LED chip, or the growth substrate can be fully or partially removed.

It is also understood that additional layers and elements can also be included in the LED chips 48, including but not limited to buffer, nucleation, contact, and current spreading layers, as well as light extraction layers and elements. An active region may comprise a single quantum well (SQW) structure, a multiple quantum well (MQW) structure, double heterostructure structures, or super lattice structures. The active region and doped layers may be fabricated from various types of material systems, with preferred material systems being Group-III nitride based material systems. Group-III nitrides refer to semiconductor compounds formed of nitrogen and the elements in the Group III of the periodic table, e.g., aluminum, gallium, or indium (forming AlN, GaN, or InN). Group III nitrides also include ternary compounds (e.g., AlInGaN) and quaternary compounds (e.g., aluminum indium gallium nitride (AlInGaN)). In a preferred embodiment, doped layers of a LED chip comprise gallium nitride (GaN), and the active region comprises InGaN. In alternative embodiments, doped layers may comprises AlGaN, aluminum gallium arsenide (AlGaAs), aluminum gallium indium arsenide phosphide (AlGaInAsP), aluminum indium gallium phosphide (AlInGaP) or zinc oxide (ZnO). A growth substrate of a LED may comprise any suitable (e.g., crystalline) material such as (but not limited to) silicon, glass, sapphire, silicon carbide, aluminum nitride (AlN), or gallium nitride (GaN).

A LED chip 48 may comprise a conductive current spreading structure and wire bond pads on the top surface, of which both are made of a conductive material (e.g., Au, Cu, Ni, In, Al, Ag, conducting oxides, and transparent conducting oxides) and may be deposited using known methods. A current spreading structure may include conductive portions arranged in a grid or other distributive layer on a LED chip, with the conductive portions spaced to enhance spreading of current from a pad into a LED top surface.

At least some LED chips 48 may be coated with or otherwise disposed to impinge light onto one or more lumiphors (e.g., phosphors) arranged to absorb at least some of the LED emissions and responsive emit light of a different wavelength of light. LED emissions may be fully absorbed, or only partially absorbed so that emissions from the resulting device include a combination of light from the LED and light from one or more lumiphors. In certain embodiments, at least some of the LED chips can comprise an LED that emits light in the blue wavelength spectrum, with a phosphor absorbing some of the blue light and re-emitting yellow light. The resulting LED and phosphor combination may emit a combination of blue and yellow light appearing white or non-white. In one embodiment, a yellow phosphor comprises commercially available YAG:Ce, although a full range of broad yellow spectral emission is possible using conversion particles made of phosphors based on the $(Gd,Y)_3(Al, Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce (TAG); Re=Y, Gd, La, Lu; or $Sr_{2-x-y}Ba_xCa_ySiO_4$:Eu.

In some embodiments, one or more LED chip may a blue emitting LED arranged to interact with other phosphors that absorb blue light and emit yellow or green light. Examples of yellow and/or green phosphors that may be used for such chips include the following:

(Sr,Ca,Ba)(Al,Ga)$_2$S$_4$:Eu$^{2+}$
Ba$_2$(Mg,Zn)Si$_2$O$_7$:Eu$^{2+}$
Gd$_{0.46}$Sr$_{0.31}$Al$_{1.23}$O$_x$F$_{1.38}$:Eu$^{2+}{}_{0.06}$
(Ba$_{1-x-y}$Sr$_x$Ca$_y$)SiO$_4$:Eu
Ba$_x$SiO$_4$:Eu$^{2+}$

The LED chips 48 emitting red light can comprise LED structures and materials that permit emission of red light directly from the active region. Alternatively, in other embodiments the red emitting LED chips 48 can comprise LEDs covered by a phosphor that absorbs the LED light and emits a red light. Examples of red or red/orange phosphors appropriate for this structures may include:

Lu$_2$O$_3$:Eu$^{3+}$
(Sr$_{2-x}$La$_x$)(Ce$_{1-x}$Eu$_x$)O$_4$
Sr$_2$Ce$_{1-x}$Eu$_x$O$_4$
Sr$_{2-x}$Eu$_x$CeO$_4$
SrTiO$_3$:Pr$^{3+}$,Ga$^{3+}$
CaAlSiN$_3$:Eu$^{2+}$
Sr$_2$Si$_5$N$_8$:Eu$^{2+}$

Each of the phosphors described above exhibits excitation in the desired emission spectrum, provides a desirable peak emission, has efficient light conversion, and has acceptable Stokes shift. It is understood, however, that many other phosphors can used in combination with desired solid state emitters (e.g., LEDs) to achieve the desired aggregated spectral output.

LED chips 48 can be coated with a phosphor using many different methods, with examples of suitable methods being described in U.S. Patent Application Publication Nos. 2008/0173884, 2008/0179611, and 2007/0158668. It is understood that LED packages according to the present invention can also have multiple LEDs of different colors, of which one or more may emit white light or near-white light.

The submount 42 can be formed of many different materials with a preferred material being electrically insulating, such as a dielectric. The submount 42 can comprise ceramic such as alumina, aluminum nitride, or silicon carbide; or a polymeric material such as polyimide, polyester, etc. In one embodiment, a submount material comprises a material having a high thermal conductivity, such as aluminum nitride or silicon carbide. A submount 42 may include or be coated with a high reflective material, such as reflective ceramic or metal (e.g., silver) to enhance light extraction from the package 40. In other embodiments, the submount 42 may comprise a printed circuit board (e.g., FR4, metal core PCB, or other type), sapphire, silicon carbide, silicon, copper, aluminum, steel, other metal, metal alloy, or a thermally clad insulated material.

The die pads 44 and conductive traces 46 can comprise many different materials such as metals (e.g., copper) or other conductive materials, deposited via plating and patterned via photolithographic process. Die pads 44 may also include or be plated with adhesive or bonding materials, or reflective and barrier layers or dielectric layers. LEDs may be mounted to the die pads 44 using conventional methods such as soldering.

In certain embodiments, wire bonds may pass between conductive traces 46 and LED chips 48 to convey electrical signals. In other embodiments, one or more LED chips 48 may include coplanar electrical contacts on one side of a LED (bottom side) with the majority of the light emitting surface being located on a side of the LED opposing the electrical contacts (upper side). Such flip-chip LEDs may be mounted to the submount 42 using contacts corresponding to one electrode (anode or cathode, respectively) onto the die pad 44, with the other LED electrode (cathode or anode, respectively) mounted to the traces 46.

An optical element/lens 55 may be provided over the LED chips 48 to provide environmental and mechanical protection. The lens 55 may be arranged be in different locations on the top surface of the submount 42, e.g., centered or off-center, as desirable to provide spacing for adjacent components. In some embodiments the lens 55 can be disposed in direct contact with the LED chips 48 and a top surface of the submount 42. In other embodiments, an intervening material or layer may be provided between the LED chips 48 and a top surface of the submount. A lens 55 may be formed, for example, via molding, and the lens may be shaped into different shapes to affect light output. Various lens shapes suitable for different applications include hemispheric, ellipsoid bullet, flat, hex-shaped, and square. Lens materials may include silicones, plastics, epoxies or glass. Various lens sizes may be used, with typical hemispheric lenses being greater than 5 mm in diameter, and in some embodiments greater than ~11 mm in diameter. A preferred LED array size to lens diameter ratio should be less than approximately 0.6, and preferably less than 0. In other embodiments, a lens 55 can have a diameter of at least about the same size as (or larger than) a width of the LED array. For circular LED array the diameter of the lens can be approximately the same as or larger than the diameter of the LED array. The arrangement of the LED package 40 is easily adapted for use with one or more secondary lenses or optics to facilitate beam shaping, as are well known in the art and commercially available.

The LED package 40 may include an optional protective layer 56 covering the top surface of the submount 42, e.g., in areas not covered by the lens 55. The protective layer 56 provides additional protection to the elements on the top surface to reduce damage and contamination during subsequent processing steps and use. The protective layer 56 may be formed concurrently with the lens 55, and optionally comprise the same material as the lens 55.

The lens 55 may also include features or elements arranged to diffuse or scatter light, including scattering particles or structures. Such particles may including materials such as titanium dioxide, alumina, silicon carbide, gallium nitride, or glass micro spheres, with the particles preferably being dispersed within the lens. Alternatively, or in combination with the scattering particles, air bubbles or an immiscible mixture of polymers having a different index of refraction could be provided within the lens or structured on the lens to promote diffusion of light. Scattering particles or structures may be dispersed homogeneously throughout the lens 55 or may be provided in different concentrations or amounts in different areas in or on a lens. In one embodiment, scattering particles may be provided in layers within the lens, or may be provided in different concentrations in relation to the location of LED chips 48 (e.g., of different colors) within the package 40.

Figure 3E:
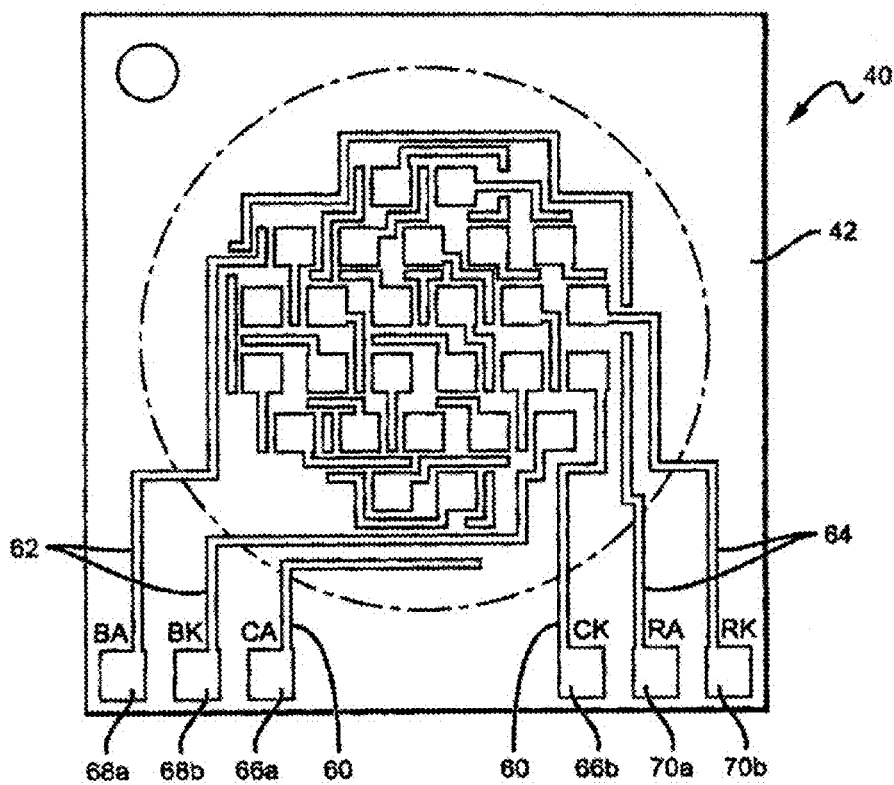
FIG. 3E is a top plan view of a die attach pad and interconnect trace arrangement for an emitter package such as illustrated in FIGS. 3A-3D.

As shown in FIG. 3E, emitter package 40 includes three contact pairs 66a-66b, 68a-68b, 70a-70b that provide external interface to three controllable circuits 60, 62, and 64 (including traces and bond pads to which solid state emitters may be coupled) formable through the package 40. Multiple solid state emitters (e.g., LED chips) may be disposed in series in each separately controllable circuit 60, 62, 64. In one embodiment, two circuits permit inclusion of up to ten LEDs each, and the other circuit permits inclusion of up to eight LEDs, for a total of up to twenty-eight LEDs operable in three separate groups. By dividing the LED chips among three circuits 50, 52, 54, the electric current may be separately applied to each circuit 50, 52, 54 and adjusted to tune the combined output of the LED package 40 to more closely approximate target color coordinates of interest, even where the individual LEDs may deviate to some degree from design output light color coordinates and/or lumen intensity. Various control components known in the art may be used to effectuate separate control of current to the three circuits 50, 52, 54.

To promote heat dissipation, the LED package 40 may include a thermally conductive (e.g., metal) layer 92 on a bottom surface of the submount 42. The conductive layer 92 may cover different portions of the bottom surface of the submount; in one embodiment as shown, the metal layer 92 cover substantially the entire bottom surface. The conductive layer 92 is preferably in at least partial vertical alignment with the LED chips 48. In one embodiment, the conductive layer is not in electrical communication with elements (e.g., LEDs) disposed on top surface of the submount 42. Heat that may concentrate below individual LED 48 chips will pass into the submount 42 disposed directly below and around each LED 48. The conductive layer 92 can aid heat dissipation by allowing this heat to spread from concentrated areas proximate the LEDs into the larger area of the layer 92 to promote conductive transfer to an external heat sink (not shown) or dissipation. The conductive layer 92 may include holes 94 providing access to the submount 42, to relieve strain between the submount 42 and the metal layer 92 during fabrication and/or during operation. In certain embodiments, thermally conductive vias or plugs that pass at least partially through the submount 42 and are in thermal contact with the conductive layer 92 may be provided. The conductive vias or plugs 74 promote passage of heat from the submount 42 to the conductive layer 92 to further enhance thermal management.

Figure 3F:
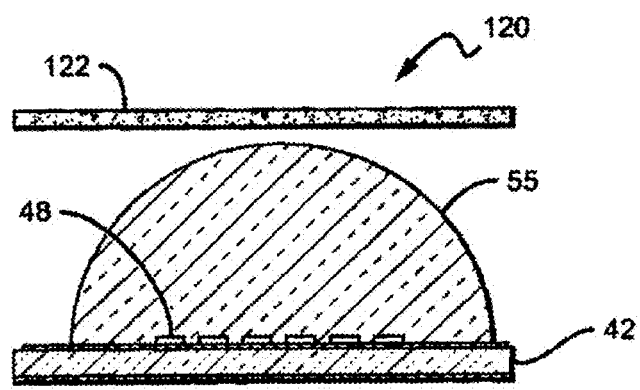
FIG. 3F is a side elevation view of a multi-emitter solid state lighting package disposed proximate to a diffuser.

FIG. 3F shows a LED component 120 comprising packaged LED chips 48 mounted on a submount 42, disposed proximate to a diffuser layer/film 122 The diffuser layer/film 122 may be disposed remotely from the lens 55 disposed over the packaged LED chips 48, but not so remotely as to provide substantial mixing of reflected light external to the lens. The diffuser 122 may be disposed at any suitable distance from the lens 55, such as 1 mm, 5 mm, 10 mm, 20 mm, or greater. The diffuser film may be provided in any suitable shape, which may depend on the configuration of the lens 55. A curved diffuser film may be spaced apart from but conformed in shape to the lens and provided in a hemispherical or dome shape. A diffuser may be directly affixed to a portion of an emitter package, alternatively, a diffuser may be supported by intermediate supports (posts) or other structures.

FIGS. 4A-4B embody data obtained from a computer simulations to model performance of a solid state lighting device. FIG. 4A is a first portion of a table including results of eleven simulations of a device including a primary blue short wavelength (exciter) LEDs (dominant λ=448 nm), a red CASN phosphor (dominant λ=604 nm), a yellow phosphor (YAG-based) (dominant λ=571 nm), and a supplemental blue LED of various wavelengths (dominant λ ranging from 502 to 461 nm) providing 10% of the total radiant flux of the lighting device, and further including results of a twelfth simulation of an otherwise identical multi-emitter solid state lighting device omitting the supplemental LWB LED. The first column represents the simulation number. The second column represents target correlated color temperature (CCT). The third through sixth columns represent dominant wavelength, peak wavelength, percent luminous flux of the aggregated emissions, and percent radiant flux (mW), respectively, for a red phosphor having the following (1931 CIE diagram) color coordinates: x=0.6409 and y=0.3587. The seventh through tenth columns represent dominant wavelength, peak wavelength, percent luminous flux of the aggregated emissions, and percent radiant flux (mW), respectively, for a yellow phosphor having the following color coordinates: x=0.4395 and y=0.5404. The eleventh through thirteenth columns represent dominant wavelength, peak wavelength, and percent radiant flux (mW) for a short wavelength blue LED (having a dominant wavelength of 448 nm) serving as an exciter for the red phosphor and the yellow phosphor (with the short wavelength blue LED, red phosphor, and yellow phosphor in combination corresponding to a WW component). The fourteenth through nineteenth columns represent dominant wavelength, peak wavelength, percent luminous flux of the aggregated emissions, percent radiant flux (mW), x color coordinate (relative to 1931 CIE diagram), and y color coordinate (relative to 1931 CIE diagram), respectively, for a supplemental blue LED of different characteristics for the various simulation runs (e.g., dominant wavelength ranging from 503 nm to 461 nm for the first through eleventh simulations). The twentieth through twenty-fourth columns represent x color coordinate, y color coordinate, correlated color temperature (CCT), Δu'v' (a measure of distance away from the target color co-ordinates), and luminous efficacy of optical radiation (LER) (representing optical efficiency of the light source perceived by a human eye), respectively, for the combined output of the red phosphor, yellow phosphor, short blue LED, and supplementary blue (e.g., including LWB) LED.

FIG. 4B represents a second portion of the table of FIG. 4A, including color rendering index (CRI) values obtained for the twelve simulations referenced in FIG. 4A. Note that CRI is obtained by analyzing reproduction of up to 14 swatches of different colors. The first column of FIG. 4B represents the simulation number, corresponding to the simulations identified in FIG. 4A. The second column represents Ra (average color rendering values for swatches 1-8). The third column represents R9a (average color rendering values for swatches 1-9). R9a is desirable to complement Ra because the color of swatch r9 is notoriously difficult to render accurately. The fourth column represents R14a (arithmetic average color rendering values for all swatches 1-14). The fifth column represents R14r (root mean square average for all swatches 1-14). The remaining columns represent color rendering values for swatches r1 to r14, respectively.

Upon consideration of FIGS. 4A and 4B, it is apparent that high CRI (Ra) values of 90 or greater may be obtained using an emitter device with a short wavelength blue LED, a red phosphor, a yellow phosphor, and a supplemental longer wavelength blue LED providing 10% of the total radiant flux of the lighting device. Values of Δu'v' range from 0.017 to 0.033, at a correlated color temperature of between 3500K-3602K (which range is significantly higher than the target CCT of 3027K). Lighting devices according to certain embodiments of the present invention preferably have a CCT of from 2500K to 5000K. Considering Ra and Δu'v' in combination, the best optimized devices of FIGS. 4A-4B appear to be those of simulation runs 1 to 6, with simulation runs 2-4 exhibiting the lowest Δu'v' values of 0.017, 0.018, and 0.019, respectively, corresponding to use of supplemental long wavelength blue emitters having a dominant wavelengths of 493 nm, 486 nm, and 483 nm, respectively.

Figure 5A:
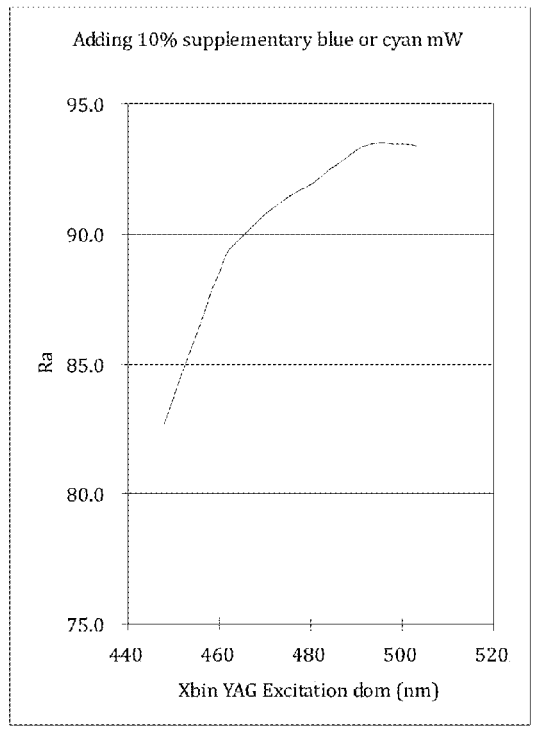
FIG. 5A is a chart representing Ra as a function of dominant emitter wavelength for the multi-emitter solid state lighting device simulations referenced in FIGS. 4A-4B.
Figure 5B:
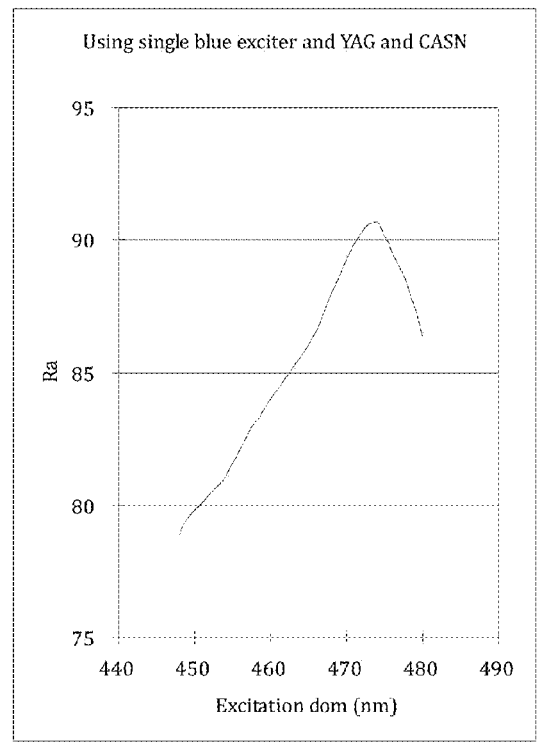
FIG. 5B is a chart representing Ra as a function of dominant emitter wavelength for a solid state lighting device including a blue LED stimulating a yellow (or green) phosphor and a red phosphor.
Figure 5C:
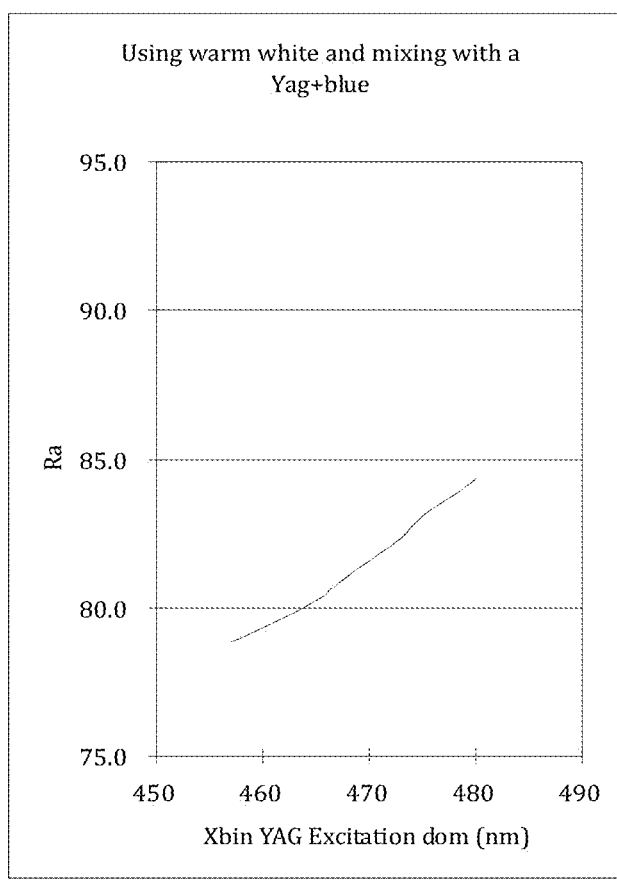
FIG. 5C is a chart representing Ra as a function of dominant emitter wavelength for a solid state lighting device including a warm white ("WW") component (including a first blue LED stimulating a red phosphor and a yellow phosphor) and a blue-shifted yellow component (including a second blue LED stimulating a yellow phosphor).

FIG. 5A is a chart representing Ra as a function of dominant emitter wavelength for the twelve (12) multi-emitter lighting device simulations (i.e., for a multi-emitter solid state lighting device including a primary blue LED stimulating a yellow phosphor and a red phosphor, and including a supplementary LWB LED providing 10% of the total radiant flux of the lighting device) referenced in FIGS. 4A-4B. FIGS. 5B-5C are provided to permit comparison with FIG. 5A. FIG. 5B is a chart representing Ra as a function of dominant emitter wavelength for a solid state lighting device including a blue LED stimulating a yellow phosphor and a red phosphor. FIG. 5C is a chart representing Ra as a function of dominant emitter wavelength for a solid state lighting device including a WW component (including a first blue LED stimulating a red phosphor and a yellow (or green) phosphor) and a blue-shifted yellow component (including a second blue LED stimulating a yellow (or green) phosphor. Minimum, median, and maximum CRI (Ra) values are significantly higher for the simulations of FIG. 5A than for the simulations of FIG. 5B or 5C, demonstrating the benefits of utilizing a supplementary LWB LED in conjunction with a short wavelength blue LED and red and yellow phosphors, in comparison to devices lacking LWB components.

FIGS. 6A-6B embody data obtained from a computer simulations to model performance of a solid state lighting device, including results of five simulations of a multi-emitter device including a primary blue LED (dominant λ=448 nm), a red CASN phosphor (dominant λ=604 nm), a yellow phosphor (YAG-based) (dominant λ=571 nm), and a supplemental blue LED of various wavelengths (dominant λ ranging from 461 to 480 nm) providing 6% of the total radiant flux of the lighting device, and further including results of a sixth simulation of an otherwise identical multi-emitter solid state lighting device omitting the supplemental LWB LED. The columns of FIG. 6A embody data for the same parameters as the corresponding columns of FIG. 4A, with the first column identifying simulation number, the second column providing target CCT, the third through sixth columns providing data for the red phosphor, the seventh through tenth columns providing data for the yellow phosphor, and the eleventh through thirteenth columns providing data for the short wavelength blue (exciter) LEDs. The fourteenth through nineteenth columns represent dominant wavelength, peak wavelength, percent luminous flux of the aggregated emissions, percent radiant flux (mW), x color coordinate (relative to 1931 CIE diagram), and y color coordinate (relative to 1931 CIE diagram), respectively, for a supplemental blue LED of different characteristics for the various simulation runs (e.g., dominant wavelength ranging from 480 nm to 465 nm for the first through fifth simulations). The twentieth through twenty-fourth columns provide aggregated values for the lighting device, including x color coordinate, y color coordinate, CCT, Δu' v', and LER respectively, for the combined output of the red phosphor, yellow phosphor, short blue LED, and supplementary blue (including LWB) LED.

FIG. 6B represents a second portion of the table of FIG. 6A, including color rendering index (CRI) values obtained for the six simulations referenced in FIG. 6A. The columns of FIG. 6B embody data for the same parameters as the corresponding columns of FIG. 4B.

Upon review of FIGS. 6A and 6B, it is apparent that high CRI (Ra) values of 87 or greater may be obtained using an emitter device with a short wavelength blue LED, a red phosphor, a yellow phosphor, and a supplemental longer wavelength blue LED providing 6% of the total radiant flux of the lighting device. Values of Δu'v' range from 0.011 to 0.017, at a correlated color temperature of between approximately 3261-3277K (which range is higher than the target CCT of 3027K, but much closer to such target than the values between 3500-3602K obtained for the simulation results provided FIGS. 4A-4B). Considering Ra and Δu'v' in combination, all five simulation runs of FIGS. 6A-6B have acceptably low Δu'v' values. The best optimized devices of FIGS. 6A-6B appearing to be those of simulation runs 1 to 4, with simulation runs 1-4 exhibiting the Δu'v' values of 0.011, 0.012, 0.013, and 0.015, respectively, corresponding to use of supplemental long blue emitters having a dominant wavelengths of 480 nm, 477 nm, 475 nm, and 470 nm, respectively.

Comparing device simulation results of FIGS. 4A-4B and FIGS. 6A-6B, higher CRI values in combination with lower Δu' v' values and higher CCT values (approximately 3500-3600K) were obtained using the devices referenced in FIGS. 4A-4B (with the supplemental LWB LED providing 10% of the total radiant flux of the lighting device), whereas, lower CRI values in combination with higher Δu'v' values and lower CCT values (between 3200-3300K) were obtained using the devices referenced in FIGS. 6A-6B (with the supplemental LWB LED providing 6% of the total radiant flux of the lighting device). In each case, the addition of a LWB supplemental LED significantly increased color rendering index as compared to a WW component including in combination a short wavelength blue LED, a red phosphor, and a yellow phosphor but lacking a LWB supplemental LED.

To validate and expand upon the foregoing device simulation results, multiple emitter packages (substantially conforming to the design of the package 40 embodied in FIGS. 3A-3E) embodying LWB supplemental LEDs were built and tested. In each case, one long wavelength supplemental blue LED (EZBright EZ1000 270-300 mW, Cree, Inc., Durham, N.C., USA) (dominant λ=484 nm, peak λ=483 nm) was used in combination with multiple WW emitter components (Cree XLamp XR-E Warm White, Bin 8C/63 lm min. flux, Cree, Inc., Durham, N.C., USA) each included a short wavelength blue LED (dominant λ=448 nm, peak λ=460 nm) with an associated red phosphor (CASN, dominant λ=604 nm, peak λ=628 nm) and yellow phosphor (YAG, dominant λ=571 nm, peak λ=555 nm).

A first group of emitter packages termed "1:25" (or "1:25 packages") each included one LWB emitter and twenty-five WW emitter components as identified above. Three controllable circuits 60, 62, 64 through the package were separately controlled via contact pairs 66a-66b, 68a-68b, and 70a-70b (as illustrated in FIG. 3E), with the three circuits being populated with three combinations of LEDs including (i) one LWB LED in series with seven WW emitter components, (ii) eight WW emitter components in series; and (iii) ten WW emitter components in series. The LWB LED was not controllable separately from the associated seven WW emitter components with which the LWB LED was disposed in series.

A second group of emitter packages termed "1:18" (or "1:18 packages") each included one LWB emitter and eighteen WW emitter components as identified above. Three controllable circuits 60, 62, 64 through the package were separately controlled via contact pairs 66a-66b, 68a-68b, and 70a-70b (as illustrated in FIG. 3E), with the three circuits being populated with three combinations of LEDs including (i) one LWB LED alone; (ii) eight WW emitter components in series; and (iii) ten WW emitter components in series. As compared to the preceding group of 1:25 packages, the 1:18 packages advantageously enabled the LWB LED to be controlled independently of all WW components (including the short wavelength blue LEDs thereof).

Figure 7A:
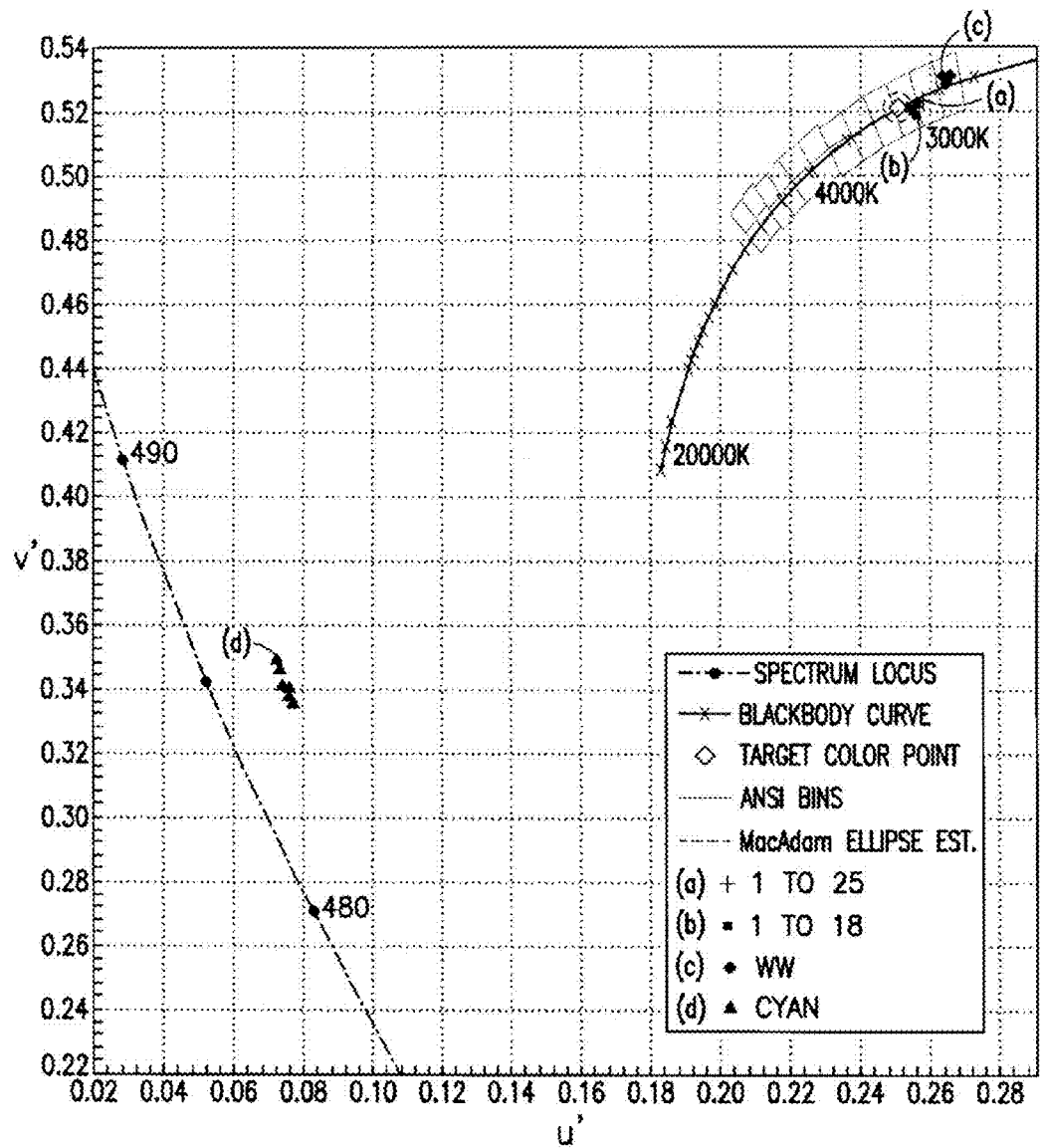
FIG. 7A includes comparative plots of color coordinates for four different solid state lighting devices on a portion of a 1976 CIE Chromaticity Diagram, including color coordinates for (a) solid state emitter devices each including one LWB LED in combination with twenty-five WW components, (b) solid state emitter devices each including one LWB LED in combination with eighteen WW components, (c) WW components, and (d) LWB LEDs.
Figures 7B, 7C:
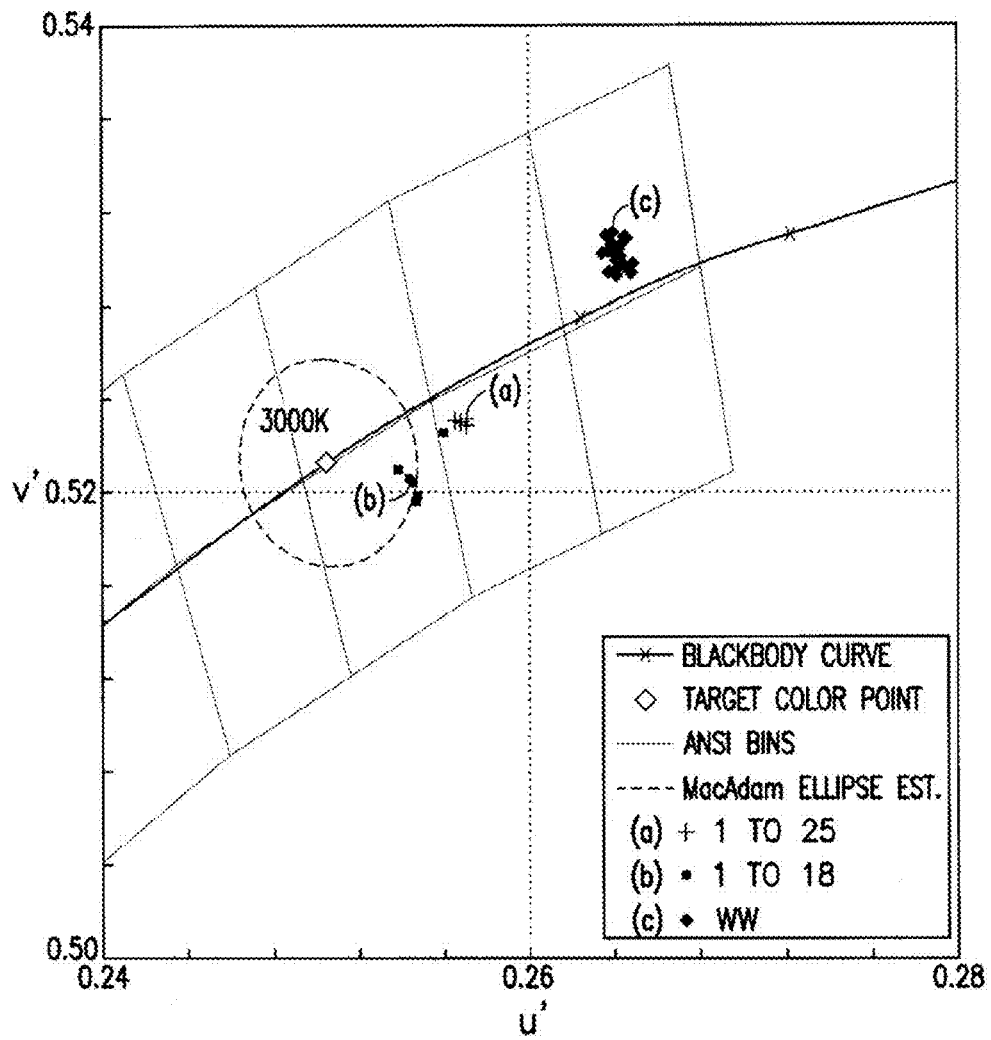
FIG. 7B is a magnified view of a portion of the chromaticity diagram of FIG. 7A, including color coordinates for (a) solid state emitter devices each including one LWB LED in combination with twenty-five WW components, (b) solid state emitter devices each including one LWB LED in combination with eighteen WW components, and (c) WW components.
FIG. 7C is a table providing radiant flux ratios, luminous flux ratios, and color rendering indices for items (a) to (c), for which color coordinates were plotted in FIGS. 7A-7B.

In one set of tests, the 1:25 packages and 1:18 packages were operated according to the parameters of FIG. 7C. The 1:25 packages were operated to attain a radiant flux ratio of 5.10% and a luminous flux ratio of 2.50% for the LWB emitter to WW emitters, and thereby achieve a CRI of 87.36. The 1:18 packages were operated to attain a radiant flux ratio of 7.06% and a luminous flux ratio of 3.45% for the LWB emitter to WW emitters, and thereby achieve a CRI of 88.2. For sake of comparison, a package embodying only one or more WW emitters as used in the foregoing 1:25 and 1:18 packages achieved a CRI of 81.46. Accordingly, each of the 1:25 and 1:18 packages embodying at least one LWB supplemental emitter provide substantially better CRI than a WW emitter package lacking a LWB supplemental emitter.

FIG. 7A includes comparative plots of color coordinates for four different solid state lighting devices on a portion of a 1976 CIE Chromaticity Diagram, including color coordinates for (a) a solid state emitter device including 1 LWB LED in combination with 25 WW components, (b) a solid state emitter device including 1 LWB LED in combination with 18 WW components, (c) a WW component, and (d) a LWB LED. FIG. 7B is a magnified view of a portion of the chromaticity diagram of FIG. 7A, including color coordinates for (a) a solid state emitter device including 1 LWB LED in combination with 25 WW components, (b) a solid state emitter device including 1 LWB LED in combination with 18 WW components, and (c) a WW component. As shown in FIG. 7B, addition of LWB spectrum causes the aggregate emissions of each of the 1:18 packages and the 1:24 packages to come closer to the blackbody locus at the CCT target of 3000K, with the 1:18 packages coming closer to the target value than the 1:24 packages or the WW emitters lacking supplemental LWB LED output.

Figure 8A:
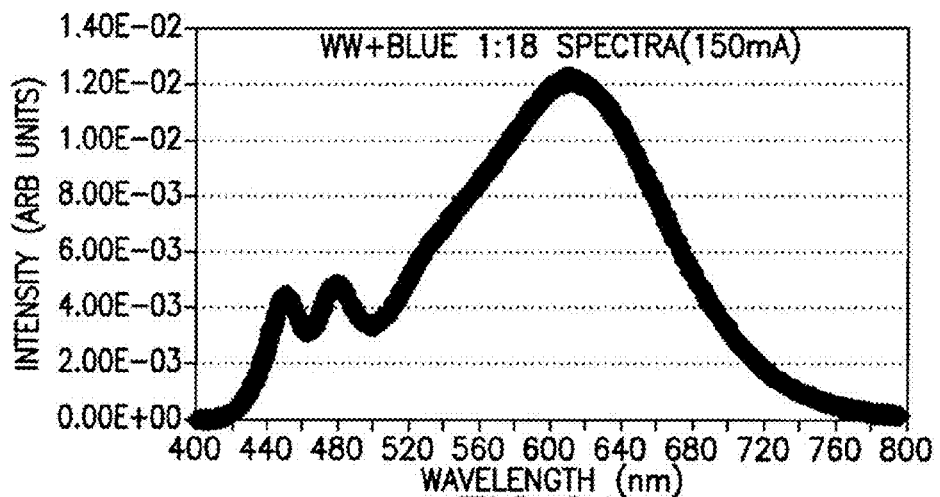
FIG. 8A is a chart of intensity as a function of wavelength between 400-800 nm for a solid state emitter device including one LWB LED in combination with eighteen WW components, with various emitters operating at current of 150 mA.
Figure 8B:
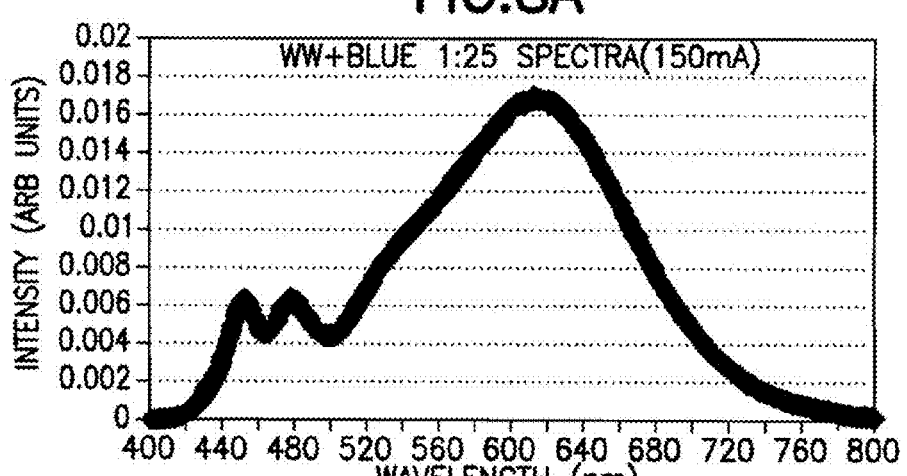
FIG. 8B is a chart of intensity as a function of wavelength between 400-800 nm for a solid state emitter device including one LWB LED in combination with twenty-five WW components, with various emitters operating at a current of 150 mA.
Figure 8C:
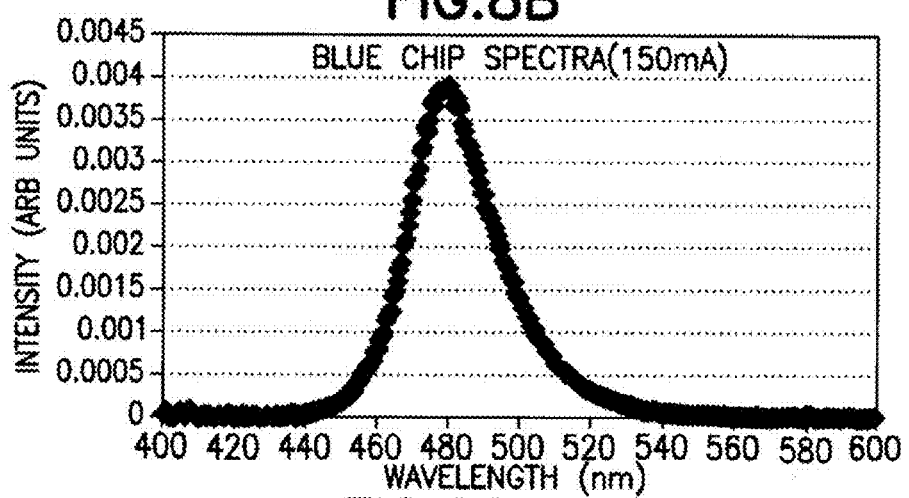
FIG. 8C is a chart of intensity as a function of wavelength for a LWB LED operated at 150 mA.

FIG. 8A is a chart of intensity as a function of wavelength between 400-800 nm for a 1:18 package including one LWB LED in combination with eighteen WW components operated in series at a current of 150 mA. FIG. 8B is a chart of intensity as a function of wavelength between 400-800 nm for a 1:25 package including one LWB LED in combination with twenty-five WW components operated in series at a current of 150 mA. FIG. 8C is a chart of intensity as a function of wavelength for a LWB LED operated at a current of 150 mA. The addition of spectrum near the 483 nm peak wavelength of the LWB LED is clearly visible as a middle 'bump' in each of FIG. 8A and FIG. 8B.

Figure 9A:
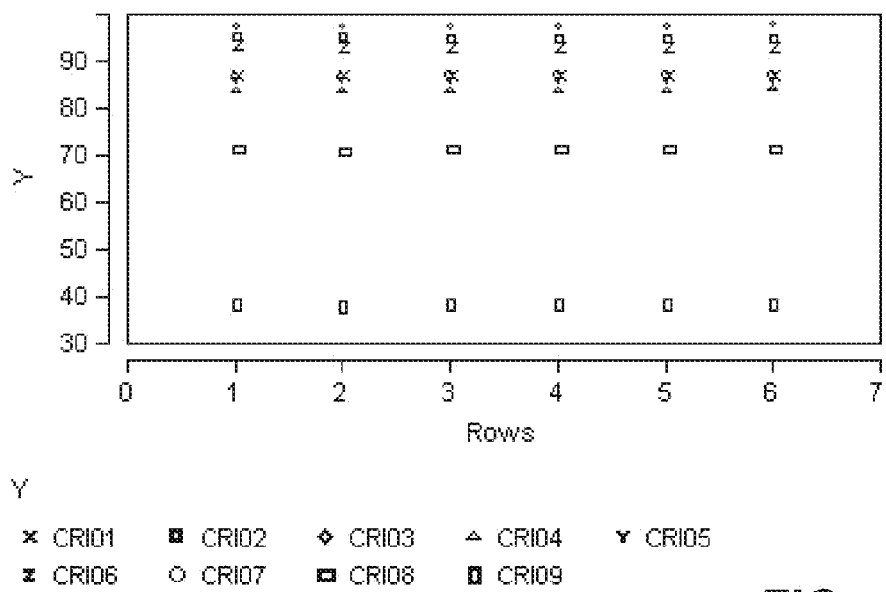
FIG. 9A is an overlay plot of color rendering index values for swatches R1 to R9 attained by six solid state emitter devices each including one LWB LED in combination with twenty-five WW components.
Figure 9B:
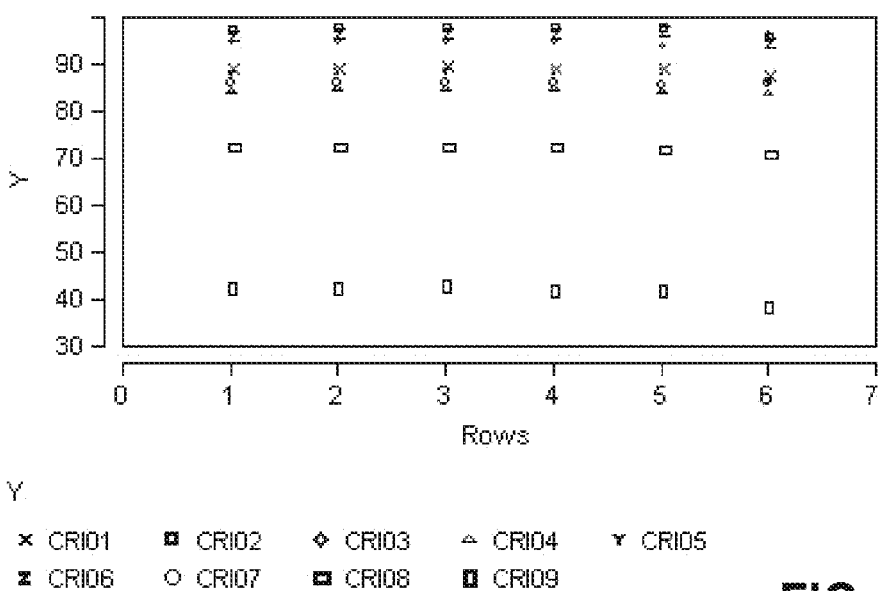
FIG. 9B is an overlay plot of color rendering index values for swatches R1 to R9 attained by six solid state emitter devices each including one LWB LED in combination with eighteen WW components.

FIG. 9A is an overlay plot of color rendering index values for swatches R1 to R9 attained by six 1:25 emitter packages as described herein. FIG. 9B is an overlay plot of color rendering index values for swatches R1 to R9 attained by six 1:18 emitter packages as described herein. Similar results were obtained by each of the 1:25 and 1:18 emitter packages. Swatches R1 to R7 were rendered by each device at values of greater than 80, but swatch R8 was rendered by each device at a value between 70 and 80. Swatch R9 was rendered by the 1:25 devices at values of less than about 40, whereas the same swatch was rendered by the 1:18 devices at values of approximately at or above 40.

FIG. 10A includes comparative plots of color coordinates for several different solid state lighting devices on a portion of a 1976 CIE Chromaticity Diagram, including color coordinates for (a) 1:25 packages each including one LWB LED in combination with twenty-five WW components, with various emitters operating at 150 mA, (b) 1:18 packages including one LWB LED in combination with eighteen WW components, with various emitters operating at 150 mA, (c) WW components operating at 150 mA, and (d) a 1:18 package including eighteen WW components operating at 150 mA, in combination with one LWB LED subjected to varying current of 140 mA to 200 mA in 10 mA steps. FIG. 10A demonstrates that the 1:18 package including the separately controllable LWB LED exhibits favorable tunability, in that a shift of 2 ANSI bins (boxes represented around the blackbody locus) is attained by changing LWB LED current from 140 mA to 200 mA, and such shift is in a direction non-perpendicular to the blackbody locus. Assuming the presence of one or more independently controllable LWB LEDs, and multiple WW components (e.g., including a short wavelength blue LED, red and/or orange phosphor, and yellow and/or green phosphor), tuning is limited to a single tie line to adjust ratio of long wavelength blue to white color. In such an embodiment, LED chip set selection (including LWB LED(s)) may define the color possibilities for the lighting device.

FIG. 10B is an overlay plot of radiant flux ratio (LWB to WW) and luminous flux ratio (LWB to WW) as a function of current supplied, for the solid state emitter device represented as data series (d) in FIG. 10A, with the emitter device including eighteen WW components operated at 150 mA in combination with one LWB LED subjected to varying current of 140 mA to 200 mA in 10 mA steps. FIG. 10B demonstrates that the 2 bin shift provided by adjusting current to the LWB emitter is provided with a LWB:WW luminous flux ratio of ~4% and a LWB:WW radiant flux ratio of ~9%.

Figure 10C:
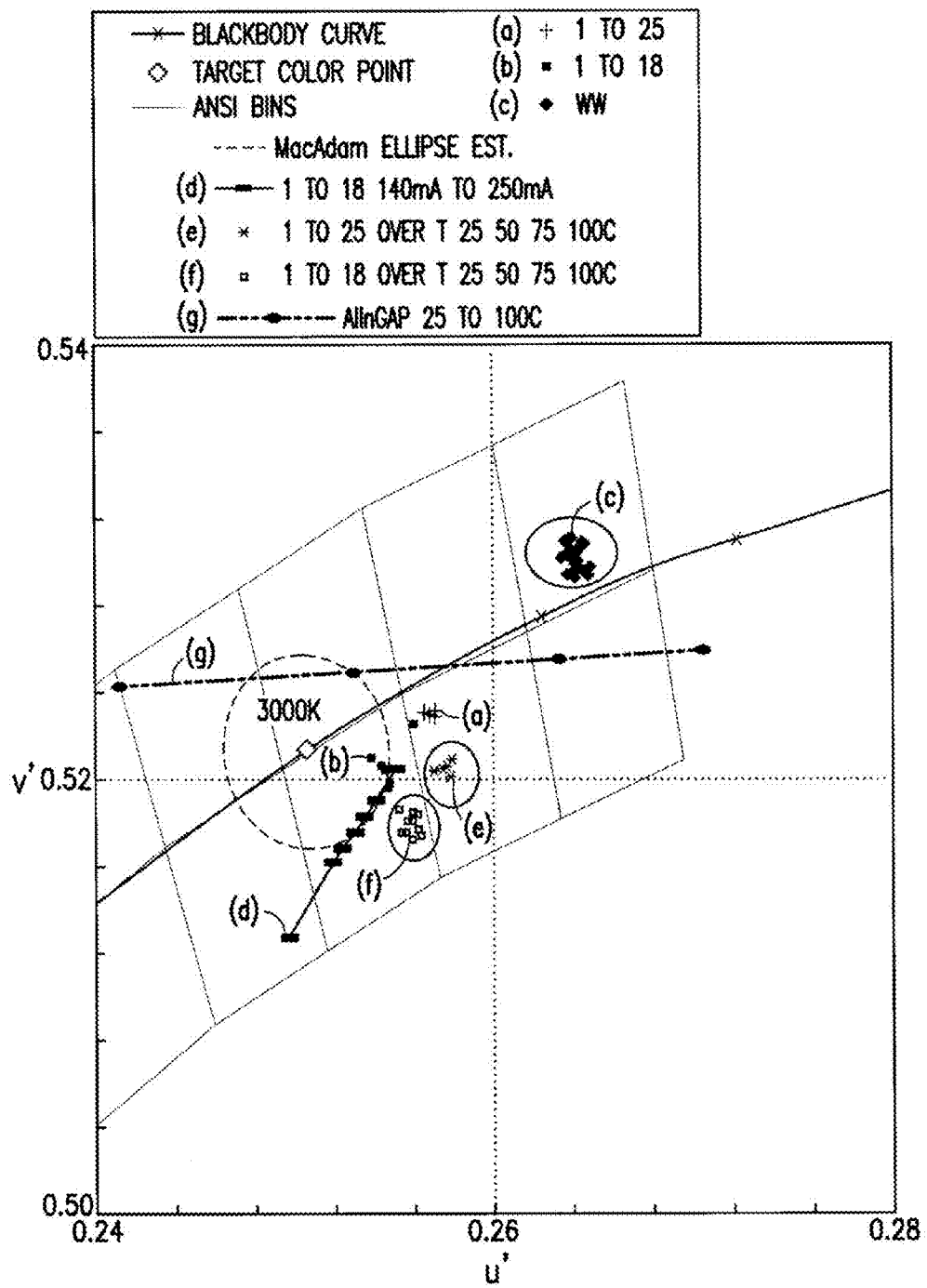
FIG. 10C includes comparative plots of color coordinates for several different solid state lighting devices on a portion of a 1976 CIE Chromaticity Diagram, including data series (a) to (d) of FIG. 10A, plus the following additional data series plots: (e) a solid state emitter device including one LWB LED in combination with twenty-five WW components operating at 150 mA, at temperatures of 25, 50, 75, and 100° C.; (f) a solid state emitter device including one LWB LED in combination with eighteen WW components, with various emitters operating at 150 mA, at temperatures of 25, 50, 75, and 100° C.; and (g) a solid state emitter device including one blue shifted yellow component (i.e., blue LED with yellow phosphor) and one AlInGaP-based red LED operated at a constant current at temperatures of 25, 50, 75, and 100° C.

FIG. 10C includes comparative plots of color coordinates for several different solid state lighting devices on a portion of a 1976 CIE Chromaticity Diagram, including data series (a) to (d) of FIG. 10A, plus the following additional data series plots: (e) a 1:25 package as described herein including one LWB LED in combination with twenty-five WW components, with various emitters operating at 150 mA and at temperatures of 25, 50, 75, and 100° C.; (f) a 1:18 package as described herein including one LWB LED in combination with eighteen WW components, with various emitters operating at 150 mA, and at temperatures of 25, 50, 75, and 100° C.; and (g) a solid state emitter device including one blue shifted yellow component (i.e., blue LED with yellow phosphor) and one AlInGaP-based red LED operated at a constant current at temperatures of 25, 50, 75, and 100° C. Data series (e) and (f) demonstrate that the 1:18 packages and 1:25 packages (each embodying LWB and WW emitters based on Group III nitride materials) provide highly stable output color (e.g., color temperature) with respect to variations in operating temperature, as evidenced by the tight clustering of data points for each series (i.e., variation of less than 0.002 in either ccx or ccy from 25° C. to 100° C.). This is in sharp contrast to the dramatic variation in color exhibited by data series (g) including a Group III nitride (e.g., GaN) based blue shifted yellow (BSY) emitter and an AlInGaP-based red LED. AlInGaP materials exhibit substantially less temperature stability than Group III nitrides. The resulting combination of a BSY emitter and AlInGaP red LED exhibits variation of more than 0.03 u' on the 1976 CIE Chromaticity Diagram over an operating temperature range of only 75° C. (from 25° C. to 100° C.). A BSY emitter may include a blue LED having a dominant wavelength in a range of from 430 nm to 480 nm, and a phosphor having a dominant wavelength in a range of from 555 nm to 585 nm. To maintain a relatively constant color point utilizing a device including a BSY emitter and AlInGaP based red LED, current to the AlInGaP emitter must be reduced as temperature increases because of the different temperature responses of the BSY emitter (having a Group III-nitride-based active region) and AlInGaP-based red LED. Such current reduction results in reduction in total flux from the combination of emitters at a desired color point, limiting utility of the device. Variation in temperature responses of the BSY emitter and AlInGaP based red LED also necessitate separate control of any BSY emitters and AlInGaP-based red emitter to maintain desired color point if a resulting lighting device is subject to variation in operating temperature, thereby foreclosing the ability to drive such emitters in series. It is therefore apparent that utilization of solid state emitters having Group III-nitride based active regions rather than active regions based on phosphides (or other material groups such as arsenides or silicides) may provide more stable output color with respect to variations in temperature, and also enable maintenance of more stable total flux at a desired color point with respect to variations in temperature. Accordingly, in one embodiment, a lighting device includes at least one solid state emitter has a nitride-based active region, and the lighting device is devoid of any solid state emitter having a phosphide-based or arsenide-based active region and arranged to contribute to or stimulate spectral output of the lighting device.

Figure 11A:
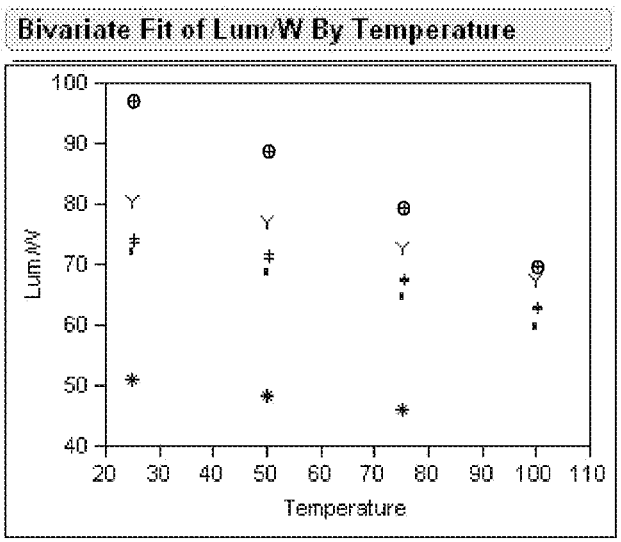
FIG. 11A provides comparative plots of lumens per watt as a function of temperature (at temperatures of 25, 50, 75, and 100° C.) for the following solid state emitter devices: (a) a device including one blue shifted yellow (BSY) component (i.e., blue LED with yellow phosphor) and one AlInGaP-based red LED; (b)(1) a solid state emitter device including eighteen WW components and one LWB LED; (b)(2) a solid state emitter device including twenty-five WW components (63 lm flux bin) and one LWB LED; (c) a solid state emitter device including twenty-four WW components (45-55 lm flux bin) and two LWB LEDs; and (d) a proposed solid state emitter device including twenty-five WW components (hypothetical 72 lm flux bin) and one LWB LED.

FIG. 11A provides comparative plots of lumens per watt as a function of temperature (at temperatures of 25, 50, 75, and 100° C.) for the following solid state emitter devices: (a) a device including one blue shifted yellow (BSY) component (i.e., blue LED with yellow phosphor) and one AlInGaP-based red LED; (b)(1) a 1:18 package as described herein including one LWB LED and 18 WW LEDs (62 lm flux bin); (b)(2) a 1:25 package as described herein including one LWB LED and 25 WW LEDs (63 lm flux bin); (c) a solid state emitter device including twenty-four WW components (45-55 lm flux bin) and two LWB LEDs; and (d) a proposed solid state emitter device including twenty-five WW components (hypothetical 72 lm flux bin) and one LWB LED. FIG. 11A illustrates that emitter device (a) exhibits the highest average efficiency, but also the greatest variation in lumens per watt with respect to change in temperature from 25° C. to 100° C. Proposed emitter device (d), which utilizes hypothetical 72 lm flux bin WW components (produced by Cree, Inc., representing a 14% boost in output over conventional 63 lm flux bin devices), exhibits the next highest average efficiency, followed by emitter devices (b)(1) and (b)(2), and distantly followed by emitter device (c).

Figure 11B:
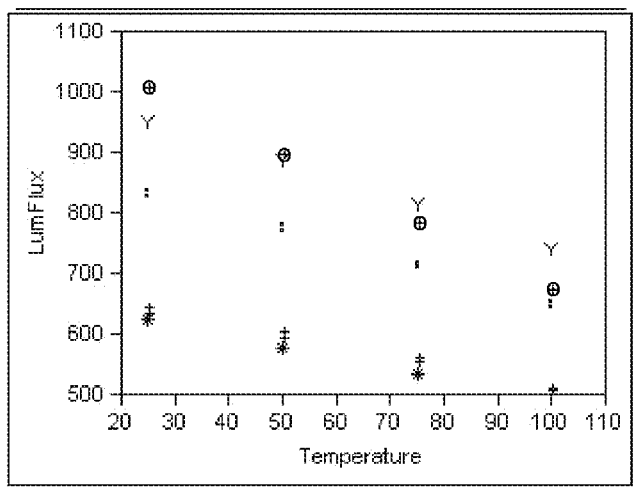
FIG. 11B provides comparative plots of luminous flux as a function of temperature (at temperatures of 25, 50, 75, and 100° C.) for the solid state emitter devices of FIG. 11A.

FIG. 11B provides comparative plots of luminous flux as a function of temperature (at temperatures of 25, 50, 75, and 100° C.) for the solid state emitter devices of FIG. 11A. FIG. 11B illustrates that emitter device (a) exhibits the highest average efficiency, but also the greatest variation in luminous flux with respect to change in temperature from 25° C. to 100° C. Proposed emitter device (d), exhibits the next highest average luminous flux, followed by emitter devices (b)(1) and (b)(2), and emitter device (c).

In each of FIGS. 11A-11B, emitter device (a) (including a BSY emitter and AlInGaP-based red LED) exhibits the most variation in lumens per watt and luminous flux with respect to variations in temperature; in each chart, plot of values for emitter device (a) exhibits the steepest downward slope. In applications subject to variations in operating temperature, reduction in luminous flux with respect to temperature would be expected to be more noticeable for emitter device (a) than emitter devices (b) to (d), which include LEDs with active regions all based on Group III-nitride materials, devoid of any LEDs based on phosphide materials (or arsenide or silicide materials).

Figures 12, 13:
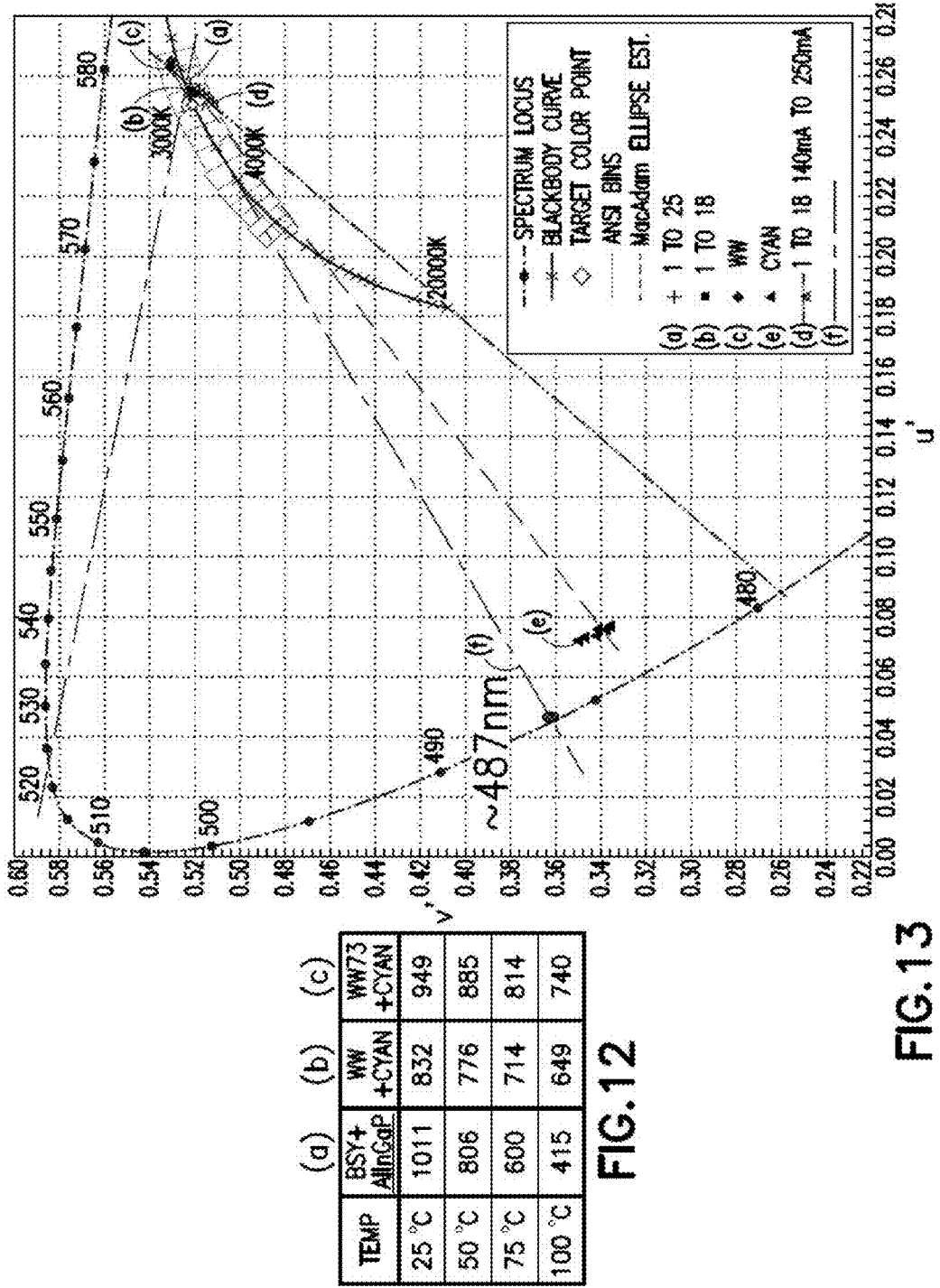
FIG. 12 is a table providing total luminous flux values as a function of temperature (at temperatures of 25, 50, 75, and 100° C.) while maintaining a constant color point for three types of solid state emitter devices: (a) a device including one blue shifted yellow component (i.e., blue LED with yellow phosphor) and one AlInGaP-based red LED; (b) a device including multiple WW components (63 lm flux bin) and 1 LWB LED; and (c) a hypothetical device including multiple WW components (72 lm flux bin) and one LWB LED.
FIG. 13 includes the same color coordinate plots of FIG. 10A on a full 1976 CIE Chromaticity diagram, with the addition of plots for (e) a LWB LED, and (f) a 487 nm LWB emitter, showing that the tie line for such emitter is substantially parallel to the blackbody locus for a color temperature of less than 3000K to about 4000K.

FIG. 12 is a table providing predicted total luminous flux values as a function of temperature (at temperatures of 25, 50, 75, and 100° C.) while maintaining a constant color point for three types of solid state emitter devices: (a) a device including one blue shifted yellow component (i.e., blue LED with yellow phosphor) and one AlInGaP-based red LED; (b) a device including multiple WW components (63 lm flux bin) and 1 LWB LED; and (c) a hypothetical device including multiple WW components (72 lm flux bin) and one LWB LED. At product use ambient conditions at or near 25° C., device (a) may provide more luminous flux than devices (b) or (c). At temperatures between 50-75° C. or greater, device (b) may provide more luminous flux than device (a). At temperatures between 25-50° C. or greater, device (c) may provide more luminous flux than devices (a) or (b). It is therefore apparent that devices (b) or (c) may be better suited to maintain high luminous flux for operation at elevated temperatures, relative to device (a).

FIG. 13 includes the same color coordinate plots of FIG. 10A on a full 1976 CIE Chromaticity diagram, with the addition of plots for (e) a LWB LED, and (f) a 487 nm LWB emitter (e.g., LED). FIG. 13 shows that the tie line for the 487 nm emitter is substantially parallel to the blackbody locus for a color temperature of less than 3000K to about 4000K. Accordingly, utilization of an emitter (e.g., a LED or lumiphor) having a dominant wavelength of ~487 nm in a device including one or more other emitters providing white spectrum should permit tuning of color temperature in a range of from about 3000K to about 4000K through operation of such emitter without departing substantially from the blackbody locus. This renders such an emitter highly desirable for color targeting. In one embodiment, the emitter having a dominant wavelength of ~487 nm is controllable independently of at least one other emitter (e.g., LED) of a multi-emitter device.

Figure 14A:
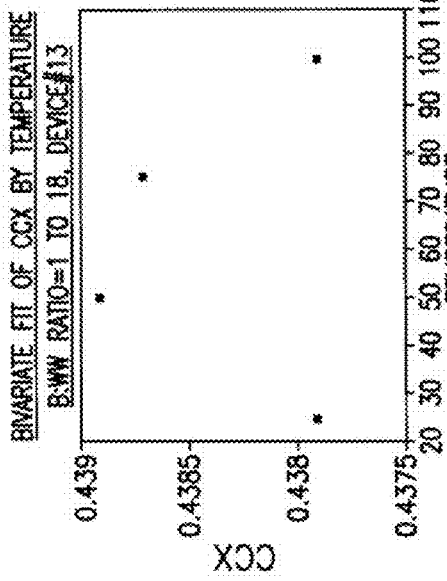
FIG. 14A is a chart including a plot of color coordinate 1931 CIE x (ccx) as a function of temperature for a solid state emitter device including 18 WW components and 1 LWB LED at temperatures of 25, 50, 75, and 100° C.
Figure 14B:
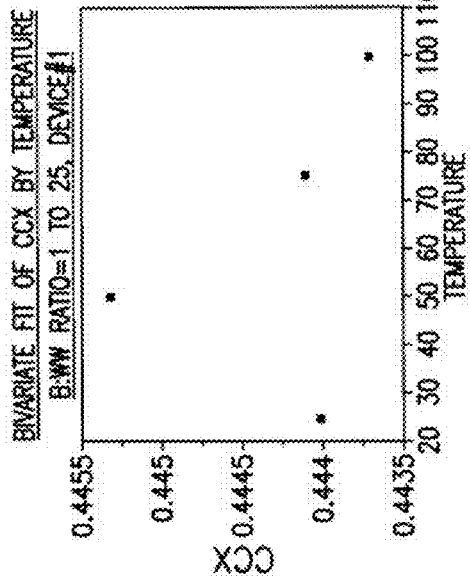
FIG. 14B is a chart including a plot of color coordinate 1931 CIE y (ccy) as a function of temperature for the solid state emitter device characterized in FIG. 14A, at temperatures of 25, 50, 75, and 100° C.
Figure 15A:
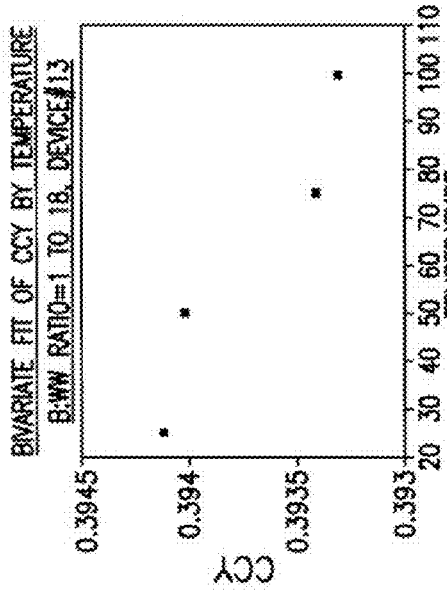
FIG. 15A is a chart including a plot of color coordinate 1931 CIE x (ccx) as a function of temperature for a solid state emitter device including twenty-five WW components and one LWB LED at temperatures of 25, 50, 75, and 100° C.
Figure 15B:
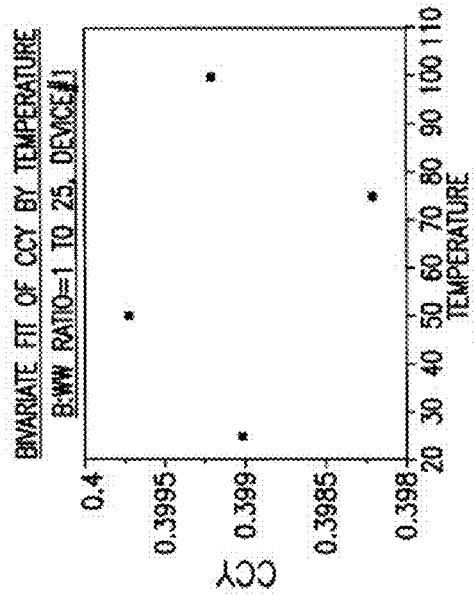
FIG. 15B is a chart including a plot of color coordinate 1931 CIE y (ccy) as a function of temperature for the solid state emitter device characterized in FIG. 15A at temperatures of 25, 50, 75, and 100° C.

FIG. 14A is a chart including a plot of color coordinate x (ccx) as a function of temperature for a 1:18 emitter package as described herein, including 18 WW components and 1 LWB LED, at temperatures of 25, 50, 75, and 100° C. FIG. 14B is a chart including a plot of color coordinate y (ccy) as a function of temperature for the same device characterized in FIG. 14A, at temperatures of 25, 50, 75, and 100° C. FIG. 15A is a chart including a plot of color coordinate x (ccx) as a function of temperature for a 1:25 emitter package as described herein, including twenty-five WW components and one LWB LED, at temperatures of 25, 50, 75, and 100° C. FIG. 15B is a chart including a plot of color coordinate y (ccy) as a function of temperature for the same device characterized in FIG. 15A at temperatures of 25, 50, 75, and 100° C. FIGS. 14A-14B and 15A-15B demonstrate that both 1:18 and 1:25 emitter packages as described herein provide highly stable output color with respect to variations in temperature, as evidenced by the variation of less than 0.002 in each of ccx and ccy over a temperature range of from 25 to 100° C.

Figure 14C:
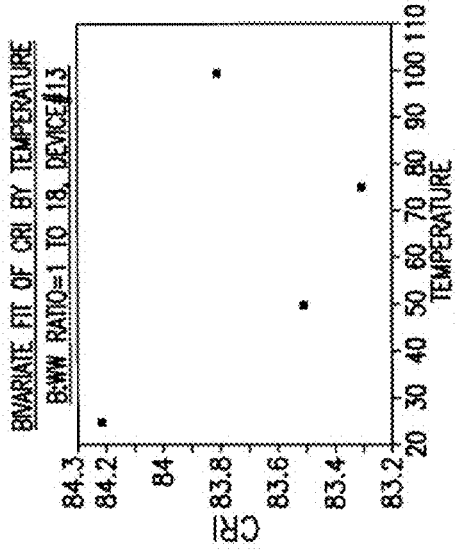
FIG. 14C is a chart including a plot of luminous flux as a function of temperature for the solid state emitter device characterized in FIGS. 14A-14B, at temperatures of 25, 50, 75, and 100° C.

FIG. 14C is a chart including a plot of luminous flux as a function of temperature for the 1:18 emitter package characterized in FIGS. 14A-14B, at temperatures of 25, 50, 75, and 100° C. The data series of FIG. 14C embodies a slope of about −1.76 lumens/° C., with luminous flux declining from a value of about 637 lumens at 25° C. to about 505 lumens at 100° C. The change in output of 132 lumens between 25° C. and 100° C. represents a decline of about 21%. Such value divided by the temperature change (75° C.) yields a decline of about 0.28% per ° C.

Figure 15C:
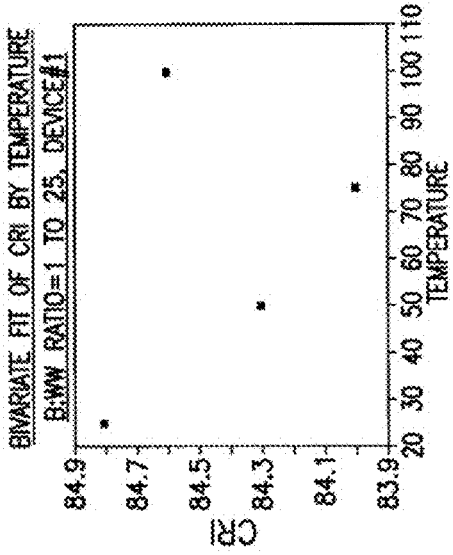
FIG. 15C is a chart including a plot of luminous flux as a function of temperature for the solid state emitter device characterized in FIGS. 15A-15B, at temperatures of 25, 50, 75, and 100° C.

FIG. 15C is a chart including a plot of luminous flux as a function of temperature for the 1:25 emitter package characterized in FIGS. 15A-15B, at temperatures of 25, 50, 75, and 100° C. The data series of FIG. 15C embodies a slope of about −2.45 lumens/° C., with luminous flux declining from a value of about 834 lumens at 25° C. to about 650 lumens at 100° C. The change in output of about 184 lumens between 25° C. and 100° C. represents a decline of about 22%. Such value divided by the temperature change (75° C.) yields a decline of about 0.29% per ° C.

Figure 14D:
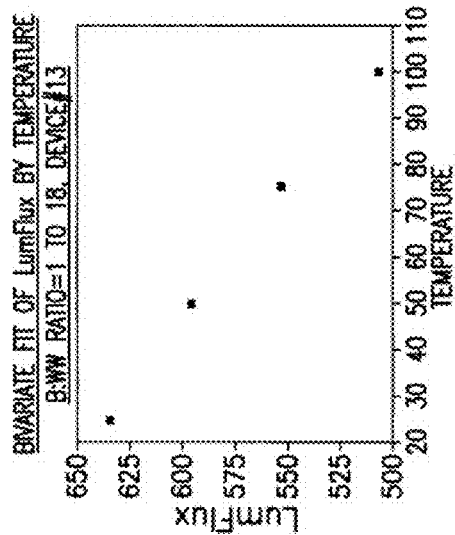
FIG. 14D is a chart including a plot of color rendering index (CRI) as a function of temperature for the solid state emitter device characterized in FIGS. 14A-14C, at temperatures of 25, 50, 75, and 100° C.
Figure 15D:
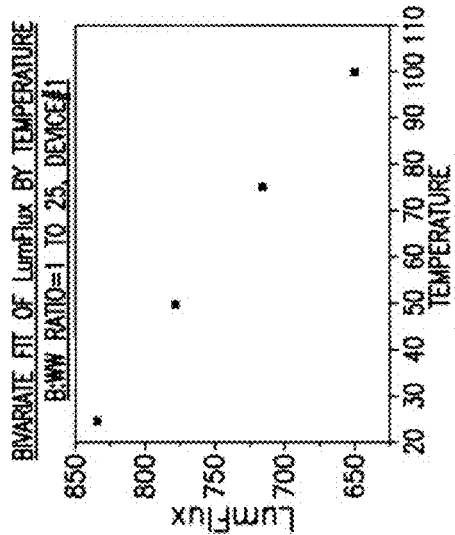
FIG. 15D is a chart including a plot of color rendering index (CRI) as a function of temperature for the solid state emitter device characterized in FIGS. 15A-54C, at temperatures of 25, 50, 75, and 100° C.

FIG. 14D is a chart including a plot of color rendering index (CRI) as a function of temperature for the 1:18 emitter package characterized in FIGS. 14A-14C, at temperatures of 25, 50, 75, and 100° C. FIG. 15D is a chart including a plot of color rendering index (CRI) as a function of temperature for the 1:25 emitter package characterized in FIGS. 15A-54C, at temperatures of 25, 50, 75, and 100° C. With respect to each device, CRI varies by less than 0.9 from 25° C. to 100° C.

Although specific solid state emitter devices were described herein in connection with FIGS. 3A-3E, it is to be appreciated that LWB emitting elements, such as LWB solid state emitters (e.g., LEDs) and/or LWB lumiphors (e.g., phosphors) may be utilized in solid state lighting devices of any of various types known in the art. Exemplary portions of solid state lighting devices incorporating LWB emitting elements are illustrated in FIGS. 16A-16E. It is to be appreciated that various structures employed within complete lighting devices (e.g., package leads, leadframes, contacts, wirebonds, bond structures, heat transfer elements, light extracting optics, diffusers, additional reflecting surfaces, power supplies bond, and the like) have been omitted for clarity of illustration, but one skilled in the art would appreciate that known structures could be incorporated in operative lighting devices including the illustrative portions provided in FIGS. 16A-16E.

Various LWB phosphors and/or short wavelength blue lumiphors may be used in devices as described herein. Examples of LWB lumiphors include, but are not limited to, the following: $MSi_2O_2N_2:Eu^{2+}$; and Zinc Sulfide:Ag with (Zn, Cd)S:Cu:Al, or other combinations. A wide bandwidth (82 nm 50% bandwidth) LWB phosphor includes $Sr_6P_5BO_{20}$:Eu; more preferable LWB phosphors have narrower wavelength bandwidth. Examples of short wavelength blue lumiphors include, but are not limited to, the following: $BaMg_2Al_{16}O_{27}:Eu(II)$; $Sr_5Cl(PO_4)_3:Eu(II)$; and $(Sr,Ca,Ba)_{10}(PO_4)_6Cl_2:Eu$.

Figure 16A:
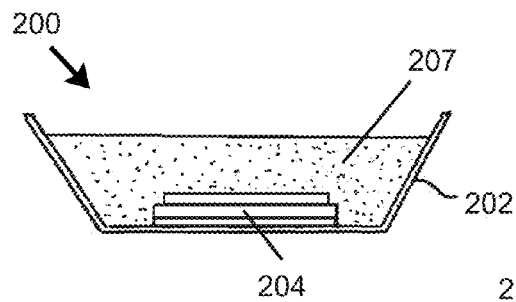
FIG. 16A is a side cross-sectional schematic view of a portion of a solid state lighting device including a LED and at least one phosphor dispersed in an encapsulant material disposed over the LED.

FIG. 16A is a side cross-sectional schematic view of a portion of a solid state lighting device 200 including a solid state emitter (LED) 204, a reflector cup 202 or similar support structure on or over which the LED 204 is mounted, and at least one lumiphor (e.g., phosphor) 207 dispersed in an encapsulant material disposed over the LED 204 and within the reflector cup 202. In one embodiment, the LED 204 comprises a short wavelength blue LED (e.g., having a dominant wavelength in a range of from 430 to 470 nm), and the at least one lumiphor includes (a) at least one first lumiphor having a dominant yellow and/or green color (e.g., dominant wavelength of from 511 to 585 nm), (b) at least one second lumiphor having a dominant red and/or orange color (e.g., dominant wavelength of from 600 to 650 nm), and (c) at least one third lumiphor having a dominant long wavelength blue color (e.g., dominant wavelength of preferably in a range of from 471 nm to 510 nm, more preferably in a range of from 471 nm to 484 nm), wherein spectral output of the lighting device 200 includes in combination at least a portion of emissions from the short wavelength blue LED, and each of the first, second, and third lumiphor. Such device may be devoid of any solid state emitter having a dominant wavelength outside a range of from 430 nm to 470 nm and arranged to contribute to or stimulate spectral output of the lighting device.

As an alternative to the preceding embodiment, an ultraviolet (UV) LED 204 (or near ultraviolet (NUV) LED) may be substituted for the short wavelength blue LED 204 in the device 200, with addition of a further short wavelength blue (fourth) lumiphor having a dominant wavelength within a range of from about 430 nm to 470 nm, wherein each lumiphor is arranged to receive emissions from the UV LED, and spectral output of the lighting device 200 includes in combination at least a portion of emissions from each of the first lumiphor, the second lumiphor, the third lumiphor, and the fourth lumiphor, with the first through fourth lumiphors having dominant wavelengths in ranges of 430-470 nm, 471-510 nm (more preferably 471-484 nm), 511-585 nm, and 600-650 nm, respectively.

Figure 16B:
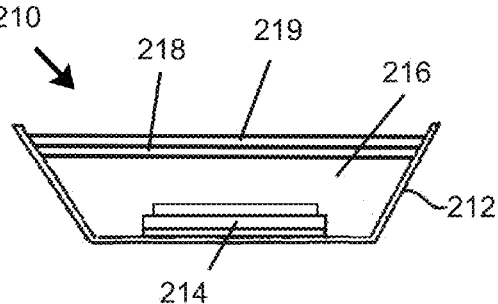
FIG. 16B is a side cross-sectional schematic view of a portion of a solid state lighting device including a LED and at least one phosphor arranged in one or more layers spatially separated from the LED.

Although FIG. 16A illustrates the at least one lumiphor 207 as being dispersed in an encapsulant material, one or more lumiphors may be disposed in any suitable conformation to receive emissions from a solid state (e.g., LED) emitter and responsively re-emit light. In one embodiment, at least one lumiphor is coated directly on or over a solid state emitter. In one embodiment, one or more lumiphors are arranged in separate layers that may be spatially separated from each solid state emitter and/or one another. In one embodiment, one or more lumiphors may be disposed remotely from at least one solid state emitter. At least one lumiphor may be spatially separated from each solid state emitter, and/or at least one other lumiphor, by a gap or void. Spatial separation between at least one lumiphor and at least one other lumiphor and/or at least one solid state emitter in various embodiments may be at least about 0.5 mm, at least 1 mm, at least about 2 mm, at least about 5 mm, or at least about 10 mm. In one embodiment, at least one lumiphor is insubstantially thermally coupled to a solid state emitter, such that conductive heating from a solid state emitter to the lumiphor is minimized. Reducing conductive thermal coupling between a lumiphor and a LED may extend the operative life of the lumiphor, and reduce spectral shift with respect to variations in emitter surface temperature FIG. 16B is a side cross-sectional schematic view of a portion of a solid state lighting device 210 including a solid state emitter (LED) 214, a reflector cup 212 or similar support structure on or over which the LED 214 is mounted, and multiple lumiphors (e.g., phosphors) 218, 219 arranged in layers that are spatially segregated from the LED 214. An encapsulant 216 may be disposed between the LED 214 and the lumiphors 218, 219; alternatively, at least one void may be arranged between the LED and the lumiphors 218, 219 to reduce conductive thermal coupling therebetween.

One advantage of utilizing a single solid state emitter (e.g., LED) in conjunction with multiple lumiphors (such as illustrated in FIGS. 16A-16B) is that point sources of different colors (such as would be present in a device having multiple LEDs of different colors) are eliminated, thus dispensing with any need for diffusers to promote color mixing. Since a diffuser may be mounted some distance from solid state emitters to provide optimal diffusive effect, elimination of a diffuser permits a resulting solid state lighting device to be substantially thinner than a comparable device including a diffuser. This enhances versatility for device mounting and placement of optics, and also reduces cost and potential unsightliness associated with diffusers.

Figure 16C:
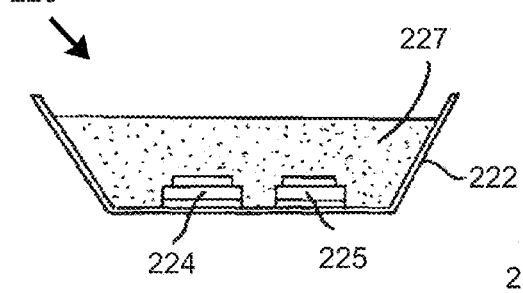
FIG. 16C is a side cross-sectional schematic view of a portion of a solid state lighting device including multiple LEDs and at least one phosphor dispersed in an encapsulant material disposed over the multiple LEDs.

FIG. 16C is a side cross-sectional schematic view of a portion of a solid state lighting device 220 including first and second solid state emitters (e.g., LEDs) 224, 225, a reflector cup 222 or similar support structure on or over which the LEDs 224, 225 are mounted, and at least one lumiphor (e.g., phosphor) 227 dispersed in an encapsulant material disposed over the LEDs 224, 225 and within the reflector cup 222. Preferably, multiple lumiphors 227 are provided. In one embodiment, one or more lumiphors may be arranged to interact with only a single LED 224, 225. At least one lumiphor may be disposed in an amount (e.g., thickness, width, etc.) or concentration that varies with respect to position within a solid state lighting device, such embodied in variations of presence, amount or concentration with respect to one or more LEDs. For example, at least one lumiphor may be coated over or arranged over one LED, and not arranged over (or arranged in a different thickness or concentration over) the other LED. In one embodiment, one LED 224 comprises a UV LED or short wavelength blue LED, and another LED 225 comprises a LWB LED.

Figure 16D:
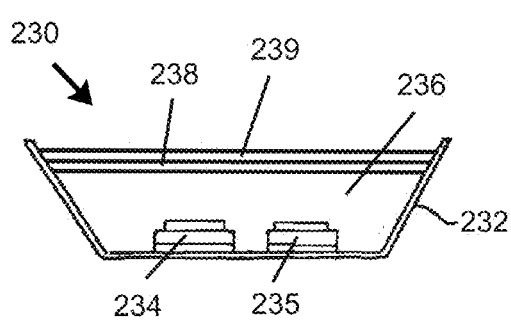
FIG. 16D is a side cross-sectional schematic view of a portion of a solid state lighting device including multiple LEDs and at least one phosphor arranged in one or more layers spatially separated from the multiple LEDs.

In one embodiment, a solid state lighting device may include multiple solid state emitters and at least one phosphor arranged in one or more layers spatially separated from the solid state emitters. FIG. 16D is a side cross-sectional schematic view of a portion of a solid state lighting device 230 including first and second solid state emitters (LEDs) 234, 235, a reflector cup 232 or similar support structure on or over which the LEDs 234, 235 are mounted, and at least one but preferably multiple lumiphors (e.g., phosphors) 238, 239 arranged in layers that are spatially segregated from the LEDs 234, 235. An encapsulant 236 or other material may be disposed between the LEDs 234, 235 and the lumiphors 238, 239; alternatively, the LEDs 234, 235 and lumiphors 238, 239 may be separated by a gap. In one embodiment, the lumiphors 238, 239 may be arranged in alternating layers including at least two non-adjacent layers comprising lumiphors of substantially same material composition. One advantage of confining different lumiphors to different layers is to avoid undue absorption of emission spectrum of one lumiphor that may overlap with excitation spectrum of another lumiphor (e.g., excitation spectrum of a red phosphor may overlap with emission spectrum of a yellow phosphor) which would result in loss of efficiency). In one embodiment, presence of a lumiphor material may be non-uniform (e.g., patterned) within an individual lumiphor layer. In one embodiment, a lumiphor material layer may have a thickness that is non-uniform with respect to position.

Figure 16E:
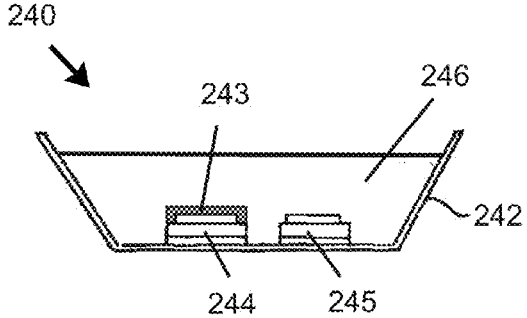
FIG. 16E is a is a side cross-sectional schematic view of a portion of a solid state lighting device including multiple LEDs, with at least one LED having a phosphor material individually applied or coated over at least one surface of the LED.

FIG. 16E is a side cross-sectional schematic view of a portion of a solid state lighting device 240 including first and second solid state emitters (LEDs) 244, 245, a reflector cup 242 or similar support structure on or over which the LEDs 244, 245 are mounted, and at least one lumiphor 243 arranged to interact only (or primarily only) with a single LED 244. The at least one lumiphor 243 may be coated or deposited on or over a first LED 244 but omitted from the second LED 245. The at least one lumiphor 243 may include a mixture of multiple lumiphors, and/or multiple layers of lumiphors having different material compositions.

Any of the embodiments of FIGS. 16C-16E is preferably arranged to output aggregated emissions including at least four color peaks, with at least one short wavelength blue peak, at least one long wavelength blue peak, at least one yellow and/or green peak, and at least one red and/or orange peak. Combinations of solid state emitters illustrated in FIGS. 16C-16E may have dominant wavelengths that are short wavelength blue, LWB, ultraviolet and/or near ultraviolet. In certain embodiments, solid state emitters of substantially different dominant wavelengths are provided in the same emitter device; in other embodiments, multiple emitters of the same dominant wavelength may be provided in the same emitter device. Lumiphors may be arranged to interact with any one or more of the solid state emitters. Although only two solid state emitters are illustrated in each of FIGS. 16C-16E, it is to be appreciated that any desirable number of solid state emitters may be provided in a single device, and such device may embody at least one of the following features: the solid state emitters are disposed on or over a common submount; the solid state emitters are connected to a common leadframe, and the solid state emitters are arranged to emit light for reflection by a common reflector.

In certain embodiments, a lighting device as described herein including a LWB emitting component (whether embodied in a LWB solid state emitter or a LWB lumiphor), together with components arranged to emit light having dominant wavelength in the short wavelength blue region (e.g., 430-470 nm), red and/or orange region (e.g., 600-650 nm), and yellow and/or green regions (e.g., 510-585) provides a color rendering index of preferably greater than 85 (more preferably at least about 90, still more preferably at least about 93) and efficiency of greater than 50 lumens per watt (more preferably greater than 60 lumens per watt, and still more preferably greater than 70 lumens per watt). Such device may also exhibit color stability with respect to temperature in a range of $\Delta u'\ v'\leqq 0.008$ (more preferably in a range of $\Delta u'\ v'\leqq 0.004$) of over a temperature change of (at least) 75° C. Such device may have a CCT of preferably from about 2500K to about 5000K, more preferably from about 3000K to about 4000K. If an ultraviolet and/or near-ultraviolet solid state emitter is present with multiple phosphors, in one embodiment a lighting device may be devoid of any solid state emitter having substantial emissions outside the ultraviolet range and the near ultraviolet range and arranged to contribute to or stimulate spectral output of the lighting device. If a short wavelength blue solid state emitter is present with multiple phosphors, in one embodiment a lighting device may be devoid of any solid state emitter having a dominant wavelength outside the short wavelength blue region (e.g., 430-470 nm) and arranged to contribute to or stimulate spectral output of the lighting device. In other embodiments, at least one UV solid state emitter, NUV solid state emitter, and/or short wavelength blue solid state emitter may be supplemented with one or more LWB LEDs and/or LWB lumiphors.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Any of various elements or features recited herein is contemplated for use with other features or elements disclosed herein, unless specified to the contrary. Correspondingly, the invention as hereinafter claimed is intended to be broadly construed and interpreted, as including all such variations, modifications and alternative embodiments, within its spirit and scope.

What is claimed is:

1. A lighting device comprising:
   at least one electrically activated first solid state emitter having a first dominant wavelength in a range of from 430 nm to 470 nm;
   at least one electrically activated second solid state emitter having a second dominant wavelength in a range of from 471 nm to 493 nm;
   at least one electrically activated third solid state emitter having a third dominant wavelength in a range of from 600 nm to 650 nm; and
   at least one lumiphor overlying, located remotely from, and arranged to receive emissions from any of the at least one first solid state emitter and the at least one second solid state emitter, and to responsively emit light having a fourth dominant wavelength that differs from the first, second, and third dominant wavelength;
   wherein spectral output of the lighting device includes in combination at least a portion of emissions from each of the at least one first solid state emitter, the at least one second solid state emitter, the at least one third solid state emitter, and the at least one lumiphor.

2. The lighting device of claim 1, wherein the at least one second solid state emitter has a second dominant wavelength in a range of from 471 nm to 484 nm.

3. The lighting device of claim 1, wherein the at least one lumiphor has a fourth dominant wavelength in a range of from 511 nm to 585 nm.

4. The lighting device of claim 1, wherein the at least one lumiphor has a fourth dominant wavelength in a range of from 555 nm to 585 nm.

5. The lighting device of claim 1, wherein the at least one lumiphor has a fourth dominant wavelength in a range of from 471 nm to 510 nm.

6. The lighting device of claim 1, adapted to provide a color rendering index of greater than 85, and efficacy of greater than 50 lumens per watt.

7. The lighting device of claim 1, wherein each solid state emitter comprises a LED, and the at least one lumiphor comprises a phosphor.

8. The lighting device of claim 1, wherein the at least one first solid state emitter, the at least one second solid state emitter, and the at least one third solid state emitter are disposed on or over a common submount.

9. The lighting device of claim 1, wherein the at least one first solid state emitter, the at least one second solid state emitter, and the at least one third solid state emitter are connected to a common leadframe.

10. The lighting device of claim 1, wherein the at least one first solid state emitter, the at least one second solid state emitter, and the at least one third solid state emitter are arranged to emit light for reflection by a common reflector.

11. The lighting device of claim 1, wherein the at least one lumiphor comprises a first lumiphor and a second lumiphor, and any of the first lumiphor and the second lumiphor is disposed relative to the at least one first solid state emitter and the at least one second solid state emitter in a quantity or concentration that differs with respect to the at least one first solid state emitter and the at least one second solid state emitter.

12. The lighting device of claim 1, wherein radiant flux of the at least one second solid state emitter is in range of less than or equal to about 10% of total radiant flux of the lighting device.

13. The lighting device of claim 1, wherein radiant flux of the at least one second solid state emitter is in range of less than or equal to about 6% of total radiant flux of the lighting device.

14. A method comprising illuminating an object, a space, or an environment utilizing a lighting device according to claim 1.

15. The lighting device of claim 1, wherein the at least one first solid state emitter comprises a plurality of first solid state emitters.

16. The lighting device of claim 1, wherein the at least one second solid state emitter comprises a plurality of second solid state emitters.

17. The lighting device of claim 1, wherein the at least one lumiphor comprises a first lumiphor and a second lumiphor, and wherein the first lumiphor comprises a peak wavelength that differs from a peak wavelength of the second lumiphor.

18. The lighting device of claim 17, wherein the first lumiphor is arranged in a first discrete layer, and the second lumiphor is arranged in a second discrete layer.

19. The lighting device of claim 1, wherein the at least one lumiphor is spatially separated from each of the at least one first solid state emitter, the at least one second solid state emitter, and the at least one third solid state emitter by a distance of at least 0.5 mm.

20. The lighting device of claim 1, further comprising an encapsulant material arranged between the at least one lumiphor and any of the at least one first solid state emitter, the at least one second solid state emitter, and the at least one third solid state emitter.

* * * * *